United States Patent [19]
Chevallier et al.

[11] Patent Number: 5,687,117
[45] Date of Patent: Nov. 11, 1997

[54] SEGMENTED NON-VOLATILE MEMORY ARRAY WITH MULTIPLE SOURCES HAVING IMPROVED SOURCE LINE DECODE CIRCUITRY

[75] Inventors: Christophe J. Chevallier, Palo Alto; Vinod C. Lakhani, Milpitas, both of Calif.

[73] Assignee: Micron Quantum Devices, Inc., Santa Clara, Calif.

[21] Appl. No.: 606,215

[22] Filed: Feb. 23, 1996

[51] Int. Cl.$^6$ .................................................. G11C 7/00
[52] U.S. Cl. ........................... 365/185.12; 365/185.11; 365/185.13; 365/185.29; 365/218
[58] Field of Search .......................... 365/185.11, 185.12, 365/185.05, 185.13, 185.29, 218

[56] References Cited

U.S. PATENT DOCUMENTS

| | | | |
|---|---|---|---|
| 5,033,023 | 7/1991 | Hsia et al. | 365/185.12 |
| 5,239,505 | 8/1993 | Fazio et al. | 365/185.11 |
| 5,384,742 | 1/1995 | Miyakawa et al. | 365/185.12 |

*Primary Examiner*—Son T. Dinh
*Attorney, Agent, or Firm*—Limbach & Limbach L.L.P.

[57] ABSTRACT

A flash memory array arrangement having a plurality of erase blocks which can be separately erased. The erase blocks have separate source lines, the state of which is controlled by a source line decoder. In array read, program and erase operations, the source lines of the deselected erase blocks, the blocks that are not being read, programmed or erased, are set to a high impedance level. If a cell in one of the deselected erase blocks is defective in some respect such that the cell is conducting leakage current, the high impedance source line associated with the cell will reduce the likelihood that the defective cell will prevent proper operation of the selected erase block.

42 Claims, 12 Drawing Sheets

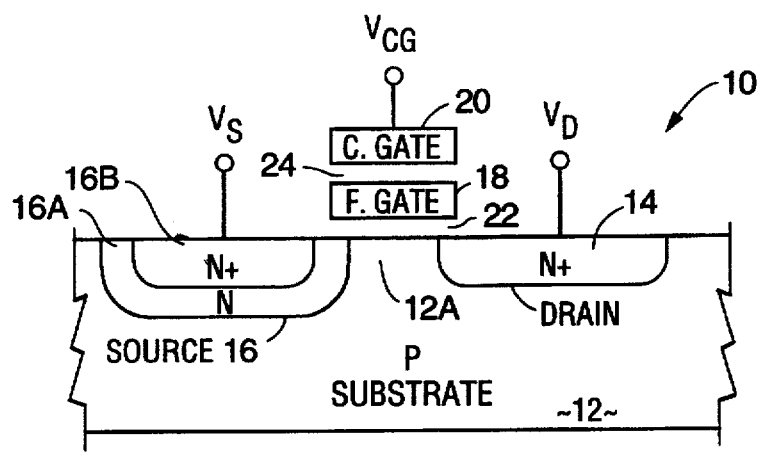
FIG. 1
(PRIOR ART)
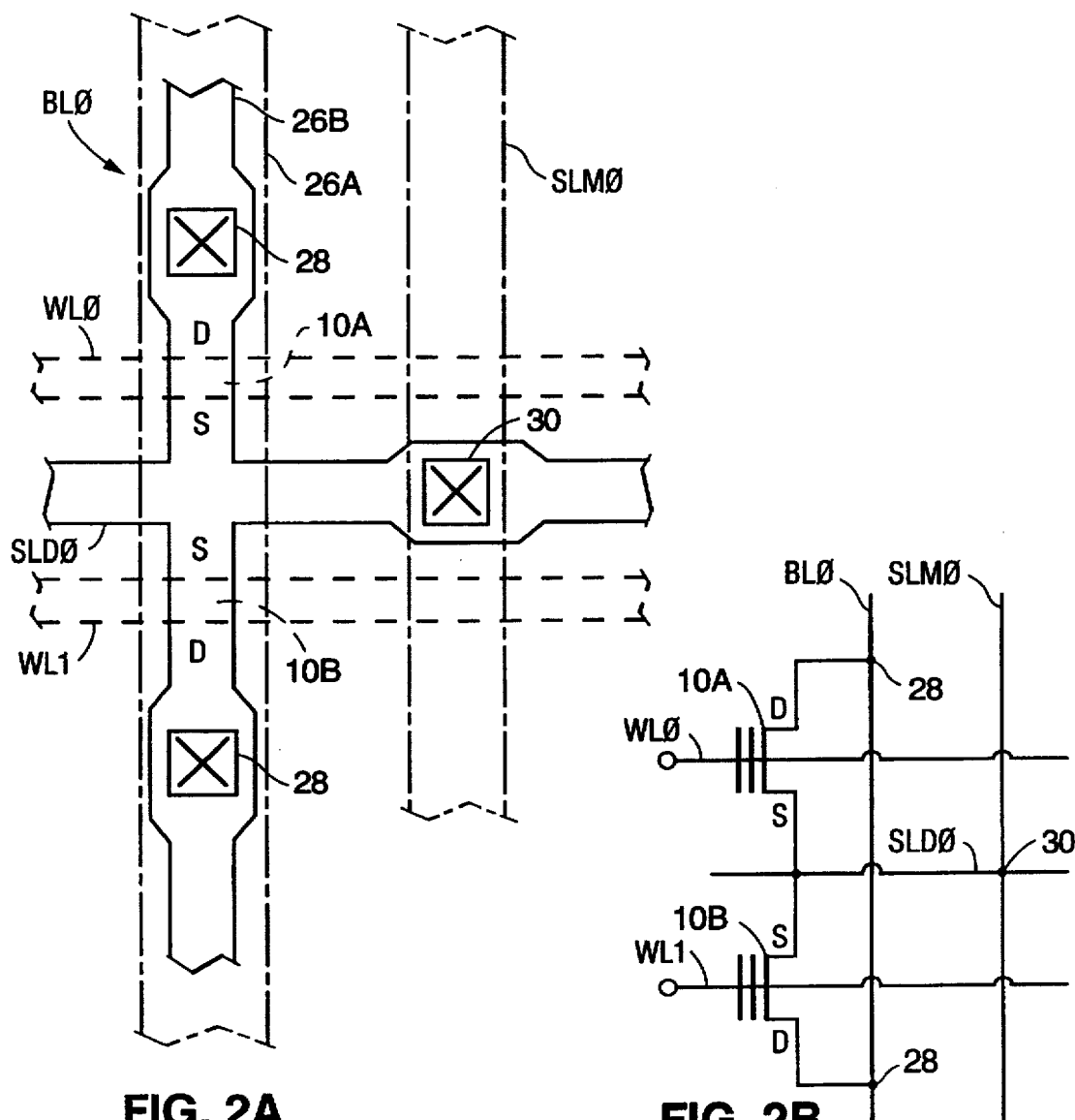
FIG. 2A
(PRIOR ART)
FIG. 2B
(PRIOR ART)

SEGMENTED NON-VOLATILE MEMORY ARRAY WITH MULTIPLE SOURCES HAVING IMPROVED SOURCE LINE DECODE CIRCUITRY

BACKGROUND OF THE INVENTION

The present invention relates generally to semiconductor memory systems and in particular to a segmented non-volatile memory array having multiple sources so that blocks of the array can be erased separately and having improved source line decode circuitry.

BACKGROUND ART

Non-volatile semiconductor memory systems have become increasingly popular, including flash memory systems. FIG. 1 is a simplified diagram of the cross-section of a typical flash memory cell 10. Cell 10 is an N-channel device formed in a P-type substrate 12. An N-type drain region 14 is formed in substrate 12 as is an N-type source region 16. Source region 16 includes an N-type region 16A formed in the substrate 12 having a an N+-type region 16B formed inside region 16A so as to form a graded source region 16.

The drain and regions source 14 and 16 are spaced apart from one another so as to form a channel region 12A in the substrate intermediate the two regions. A floating gate 18 is disposed above the channel region 12A and a control gate 20 is disposed above the floating gate 18. The floating gate is separated from the channel region 12A by a thin (100 Å) gate oxide layer 22. The floating and control gates 18 and 20 are typically both formed from doped poly silicon. The control gate 20 is separated from the floating gate 18 by an interpoly dielectric layer 24. Other than being capacitively coupled to other elements of cell 10, the floating gate 18 is electrically isolated from the rest of the cell.

Table 1 below shows typical conditions for performing program, read and erase operations (two approaches) on flash cell 10.

TABLE 1

| OPERATION | SOURCE ($V_S$) | DRAIN ($V_D$) | CONTROL GATE ($V_G$) |
|---|---|---|---|
| READ | ground | +1.5 volts | +5 volts |
| PROGRAM | ground | +6 volts | +12 volts |
| ERASE 1 | +12 volts | float | ground |
| ERASE 2 | +5 volts | float | −10 volts |

If cell 10 is in an erased state, the cell will have a threshold voltage, called an erased threshold voltage, which is typically approximately +2 volts. If the cell is in a programmed state, the cell will have a programmed threshold voltage of typically approximately +6 volts. In a read operation, the control-gate-to-source voltage of the cell is +5 volts as can be seen from Table 1, above. The drain 14 will be connected to a small positive voltage of typically +1.5 volts and the source 16 is grounded. Thus, if the cell 10 is in a programmed state, the cell will not conduct current in the read operation since the gate-to-source voltage of +5 volts is less than the programmed threshold voltage of +6 volts. If the cell is in an erased state, the gate to source voltage will exceed the erased threshold voltage so that the cell will conduct current. The presence or absence of cell current in a read operation is detected by a sense amplifier so that the state of the cell can be determined.

In order to program the flash cell 10, Table 1 indicates that the source 16 is grounded and the drain 14 is connected to +6 volts. The control gate 20 is connected to a high voltage such as +12 volts. The combination of conditions will cause electrons to travel from the source 16 towards the drain 14. Some of these electrons will possess sufficient energy to pass through the gate oxide 22 towards the positive voltage on the control gate 20. Those electrons, sometimes referred to as hot electrons, will be deposited on the floating gate 18 and will remain there until the cell 10 is erased. The presence of electrons on the floating gate 18 will tend to increase the threshold voltage of the cell, as previously noted.

Table 1 depicts two approaches for erasing a cell. The first approach (Erase 1), a cell is erased by floating the drain 14 and applying a large positive voltage, such as +12 volts, to the source 16. The control gate 20 is grounded. This combination causes electrons stored on the floating gate 18 to pass through the thin gate oxide 22 and to be transferred to the source 16. The physical mechanism for the transfer is commonly referred to as Fowler Nordheim tunneling.

The above conditions for erasing a cell (Erase 1) have been viewed by others as disadvantageous in that the large positive voltage (+12 volts) applied to the source region is difficult to implement in an actual memory system. First, the primary supply voltage $V_{CC}$ in a typical integrated circuit memory system is +5 volts and is provided by an external power supply such as a battery. Thus, one approach would be to include a charge pump on the memory integrated circuit which is also powered by the primary supply voltage VCC. However, a typical integrated circuit memory system may include a million or more cells all or a very large group of which will be erased at the same time. Thus, the charge pump circuit must be capable of providing relatively large amounts of current on the order of 20 to 30 milliamperes. This has been viewed by others as impractical thus necessitating the use of an a second external supply voltage for producing the +12 volts applied to the source region. This would typically preclude battery powered operation where multiple batteries, such as a 5 volt primary supply battery and a +12 volts battery, is not practical.

The application of the relatively high voltage of +12 volts has also been viewed as disadvantageous in that there was believed to be a tendency to produce high energy holes ("hot" holes) at the surface of the source region 16 near the channel region 12a. These positive charges were said to have a tendency to become trapped in the thin gate oxide 20 and eventually migrate to the floating gate and slowly neutralize any negative charge placed on the floating gate during programming. Thus, over time, the programmed state of the cell may be altered. Other deleterious effects due to the presence of holes have been noted, including the undesired tendency to program non-selected cells.

The above-described disadvantages of the erase conditions set forth in Table 1 (Erase 1) have been noted in U.S. Pat. No. 5,077,691 entitled FLASH EEPROM ARRAY WITH NEGATIVE GATE VOLTAGE ERASE OPERATION The solution in U.S. Pat. No. 5,077,691 is summarized in Table 1 (Erase 2). A relatively large negative voltage ranging from −10 to −17 volts is applied to the gate 22 during an erase operation. In addition, the primary supply voltage $V_{cc}$ of +5 volts (or less) is applied to the source region 16. The drain region 14 is left floating.

Although the source current remains relatively high, the voltage applied to the source is sufficiently low that the +5 volt primary supply voltage $V_{cc}$ can be used directly or the source voltage may be derived from the primary supply voltage using a series regulator or a resistive divider in combination with a buffer circuit. In either event, since the source voltage is equal to or less than the primary supply voltage, the large source currents required in erase operations can be provided without the use of charge pump circuitry. The high impedance control gate 20 of the flash cell draws very little current. Accordingly, the large negative voltage applied to the control gate 20 in the erase operation can be provided by a charge pump circuit. Thus, according to U.S. Pat. No. 5,077,691, only a single external power supply, the +5 volt supply for $V_{cc}$, need be used.

In a flash memory system, the flash cells 10 are arranged in a cell array which typically includes several rows and several columns of cells. Each of the rows has an associated word line connected to the control gate 20 of the cells 10 located in the row. Each of the columns has an associate bit line connected to the drain 14 of each cell located in the column. The sources 16 of all of the cells of the array are usually connected in common, but as will be explained, the sources may be separately connected.

FIG. 2A is a simplified plan view of a conventional layout of a pair of flash cells 10A and 10B of a cell array. FIG. 2B is a schematic diagram of cells 10A and 10B of FIG. 2A. As can be seen in FIG. 2B, cells 10A and 10B have their respective sources connected in common. Typically, the two sources are actually a single source region shared by the two cells 10A and 10B. Cells 10A and 10B are located in a common array column and in separated rows. The column has an associated bit line BL0 which is connected to the drains of cells 10A and 10B. Cell 10A is in a row having an associated word line WL0 connected to its control gate 20 and cell 10B is in an adjacent row having its control gate 20 connected to an associated word line WL1.

The bit lines, including bit line BL0, extend vertically along the array and include an underlying diffusion component 26A of doped semiconductor material and an overlying metal line component 26B. The metal line component 26B makes electrical contact with the diffusion component 26A every two cells 10 by way of contacts 28. The source lines have a horizontal segment SLD0 which runs generally parallel to the word lines and is made of doped semiconductor material. The source lines also have a vertical segment SLM0 which runs generally parallel to the bit lines and is formed from metal. The horizontal and vertical components SLD0 and SLM0 are electrically connected by way of a contact 30 located at the intersection of the two segments every two rows of the array.

Cell 10A has its control gate 20 connected to horizontal word line WL0, a doped polysilicon line which extends across the array. Cell 10B has its control gate 20 connected to horizontal word line WL1 which also extends across the array. A flash cell (10A, 10B) is formed at the intersection of the each of the word lines and bit lines.

FIG. 3A is a simplified plan view of the layout of a relatively small conventional flash cell array 32 and FIG. 3B is a schematic diagram of the FIG. 3A array. Array 32 is comprised of twelve rows, each having an associated horizontal polysilicon word line WL0–WL11. The array also has twelve columns, with each column having an associated metal bit line BL0–BL11. Array 32 also includes four vertical metal source lines SLM0–SLM3 which are connected in common to the six horizontal diffused source lines SLD0–SLD5. Each metal source line SLMN is connected to the diffused source lines SLDN every two rows. The metal source lines SLM are spaced every four columns. For example, adjacent metal source lines SLM0 and SLM1 are separated by four bit lines BL0–BL3.

The metal source lines SLM0–SLM3 are electrically connected together by circuitry (not depicted) external to array 32. Thus, all of the source lines of the array are nominally at the same electrical potential. However, the horizontal diffused source lines SLD0–SLD5 have a relatively high resistance, in comparison to the metal source lines. This high resistance can have an adverse impact upon memory operations, particularly programming and reading operations. The use of multiple metal source lines functions to reduce the overall source line resistance. However, each metal line occupies a significant amount of integrated circuit area so that the use of multiple metal source lines will increase the die area and thereby effectively increase the cost of manufacturing the cell array.

Flash memory systems are typically erased in bulk. That means that either all or a large part of the array are erased at the same time. By way of example, the entire array 32 of FIGS. 3A and 3B would be erased in a single operation. As indicated by Table 1, this can be accomplished by applying +12 volts to the common source lines SLM0–SLM3, grounding all of the word lines WLN0–WLN11 and floating all of the bit lines BL0–BL11.

There exist conventional memory arrays which provide the capability of erasing less than the entire array. This feature is particularly useful in many memory applications where it is desirable to retain some data stored in the memory while erasing and then reprogramming other data in the memory. The capability of erasing less than the entire memory is typically accomplished by electrically isolating the source lines of individual blocks of the memory array. A particular block is erased by applying a high voltage, such as +12 volts (Table 1) to the source line associated with the block being erased The word lines of the block to be erased are grounded and the bit lines of the block are left floating. As is known, the word lines and source lines of the erase blocks not being erased, the deselected erase blocks, are grounded so that the cells in the deselected erase blocks are not erased.

In large memory arrays, there is an increased likelihood that one or more cells will be defective. There exists various techniques to correct or otherwise compensate for such defective cells so that the memory will continue to be functional. However, there are certain cell failure mechanisms that interfere with the operation of the remainder of the memory and thereby effectively prevent proper memory operation. This is especially true in memory arrays having separate erase blocks where a cell failure in one block may prevent proper operation of the remaining erase blocks.

The present invention is particularly applicable to large memory arrays having separate erase blocks. The large arrays can contain cells with certain failure modes which would ordinarily prevent proper operation of conventional memories, but which do not prevent operation of a memory using an array in accordance with the present invention. These and other advantages of the present invention will become apparent to those skilled in the art upon a reading of the following Detailed Description of the Invention together with the drawings.

SUMMARY OF THE INVENTION

An arrangement of flash memory cells including a plurality of erase blocks is disclosed. The erase blocks each include flash memory cells arranged into an array of rows and columns, with the cells in a column connected to bit lines common to each erase block and with the cells in a row connected to a common word line. Each of the erase blocks has either a single common source line or a group of common source lines.

The arrangement further includes a source line decoder circuit comprising a separate control transistor associated with each of the common source lines, with the control transistor having an input terminal connected to the associated source line and an output terminal connected to a common global source line and a control terminal for receiving a control signal that causes the transistor to switch between a conductive and non-conductive state. When a cell of a selected erase block is being read, programmed or erased, the control transistors associated with the other or deselected erase blocks are switched to the non-conductive state so that the associated source line will be at a high impedance level. The high impedance level will reduce the possibility that a defective cell present in one of the deselected erase blocks will interfere with the operation of the selected erase block.

BRIEF DESCRIPTION OF THE DRAWINGS

FIG. 1 is a simplified cross-sectional view of a conventional flash memory cell.

FIG. 2A is a plan view of the conventional layout of a pair of flash memory cells.

FIG. 2B is a schematic diagram of the conventional pair of flash memory cells of FIG. 2A.

DETAILED DESCRIPTION OF THE INVENTION

Figure 3A:
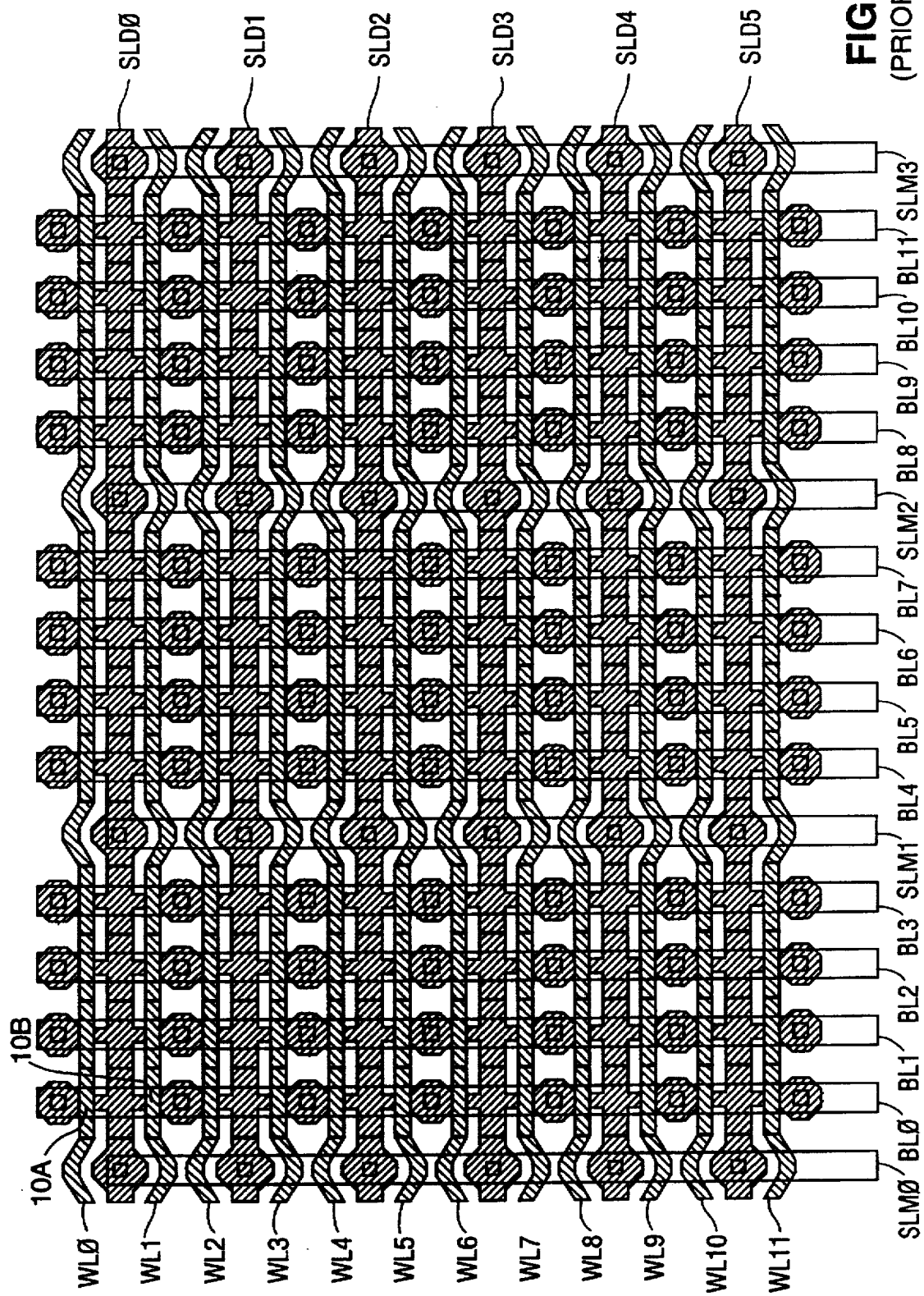
FIG. 3A is a plan view of the conventional layout of an array of flash memory cells.
Figure 3B:
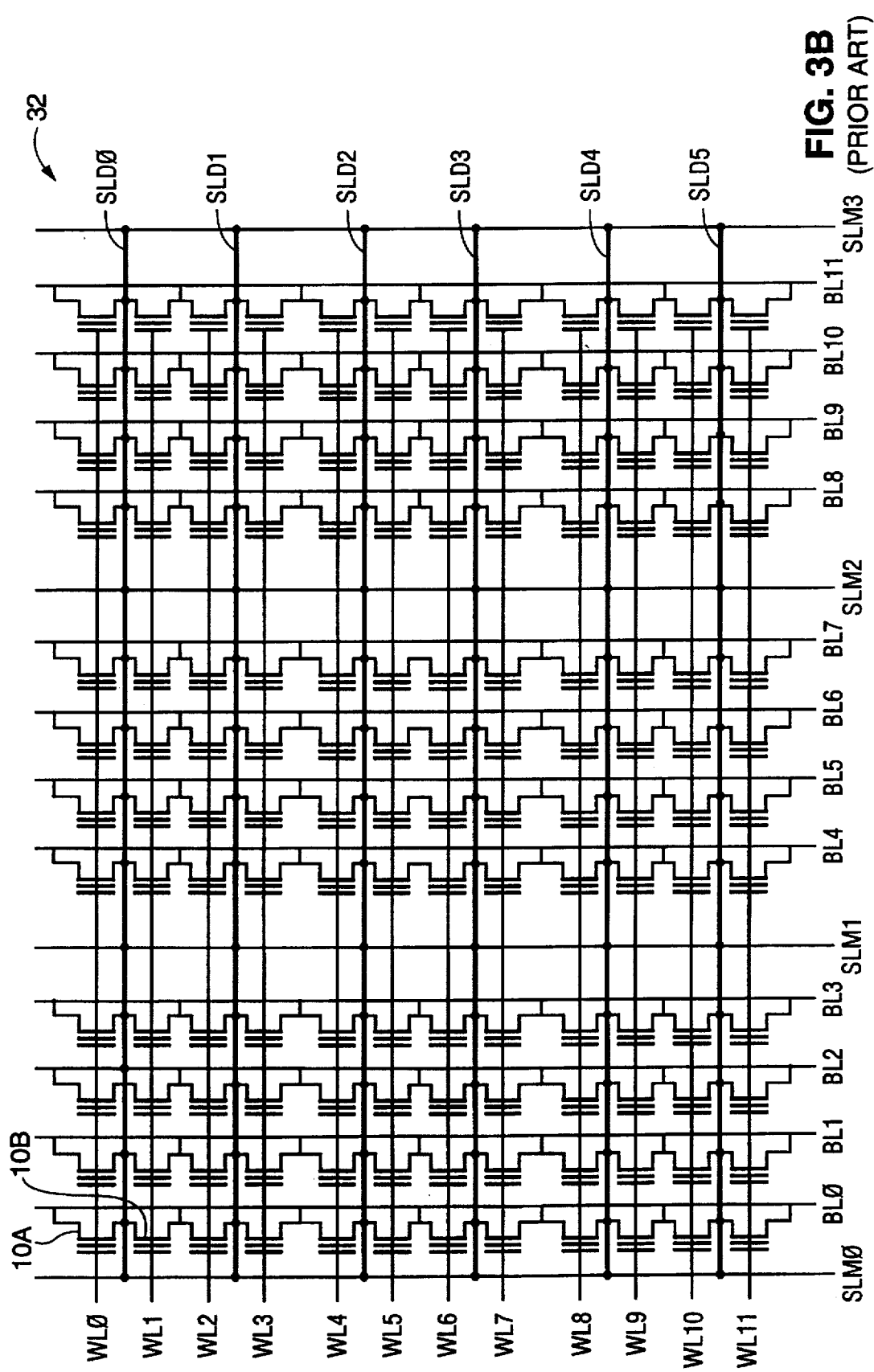
FIG. 3B is a schematic diagram of the memory cell array of FIG. 3A.
Figure 4:
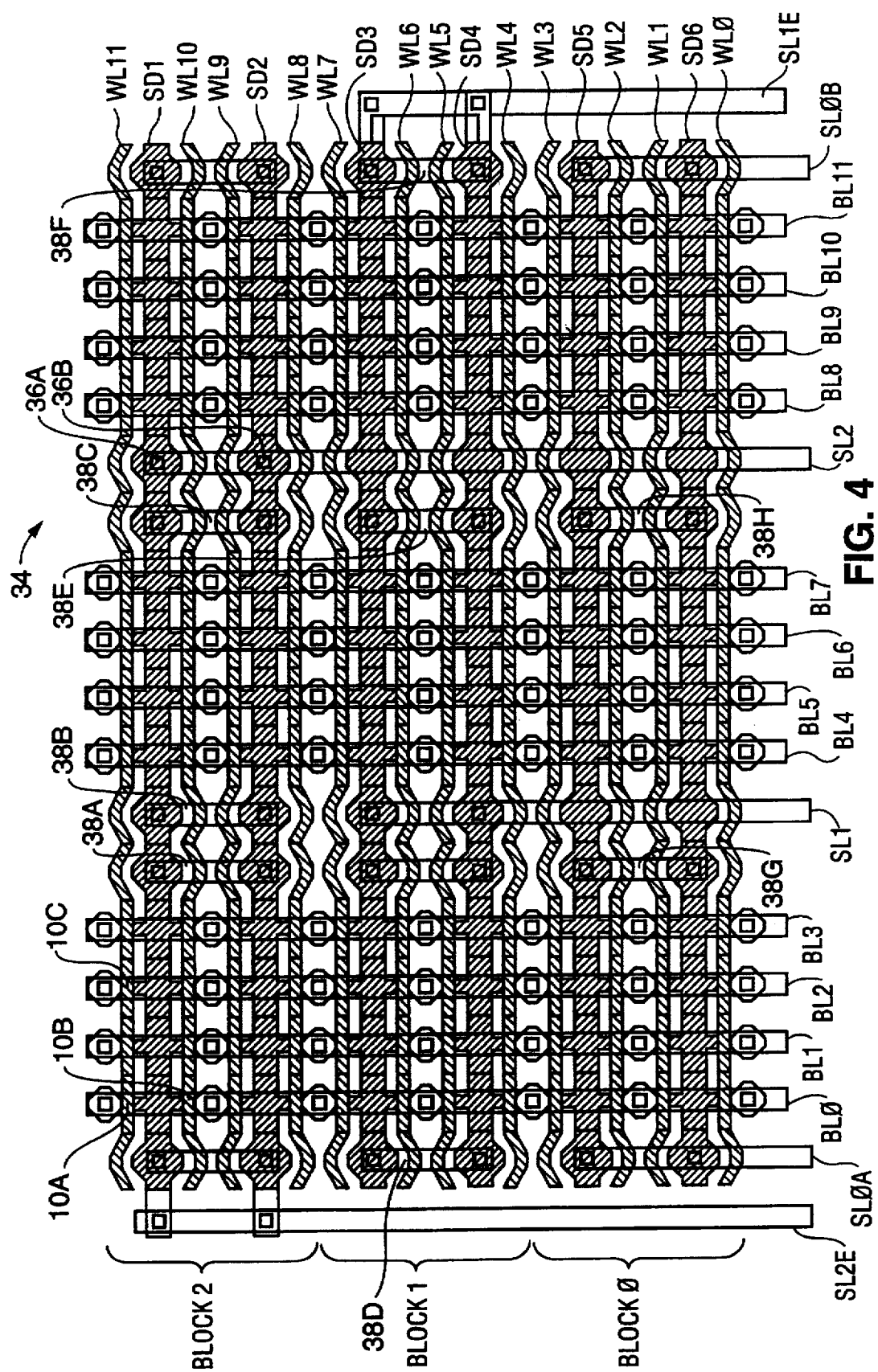
FIG. 4 is a plan view of a layout of another embodiment of a segmented flash memory cell array arrangement.

Referring again to the drawings, FIG. 4 is a plan view of the layout of a portion of a segmented flash cell array 34 suitable for use in the present invention. Array 34 is comprised of cells 10 as depicted in FIG. 1. A typical array would be much larger than exemplary array 34. The array is divided into rows and columns. The cells 10 located in a particular row have their control gates all connected to an associated word line. The cells 10 located in a particular column have their drain regions connected to a particular bit line.

Array 34 includes three erase blocks (sometimes referred to as erase segments), Blocks 0-2, each of which has separate source lines that permit each of the erase blocks to be separately erased. Each erase block includes four separate rows of flash cells 10. By way of example, Blocks 0-2 includes four rows associated with word lines WL0-WL3, WL4-WL7 and WL8-WL11, respectively. Further, all of the erase blocks include a set of twelve common columns of cells, namely, the twelve columns associated with bit lines BL0-BL11. Thus, each of the erase blocks can be viewed as including an array of flash cells. Bit lines BL0-BL11 are common to all three erase blocks.

Array 34 is fabricated using a single metal layer process so as to simplify the fabrication process. As is well known, in a single metal layer process, it is not possible for two metal tracks to cross over one another. Typically, connections are made in one direction, such as the vertical direction, using metal tracks and in another direction, such as the horizontal direction, using non-metal tracks, such as doped semiconductor tracks.

The erase blocks each include a source line structure which is connected to all of the source regions of the cells located in the erase blocks. The source line structure includes a plurality of horizontal source lines which function to interconnect all of the source regions of cells located in one of the rows. The source line structure further includes vertical source lines and source straps which function to interconnect all of the source regions of cells located in one of the columns. The horizontal source lines are doped semiconductor source line segments intermediate two adjacent word lines. By way of example, Erase Block 2 includes a first horizontal doped semiconductor segment SD1 intermediate word lines WL10 and WL11 and a second doped segment SD2 intermediate word lines WL8 and WL9. The two doped source line segments SD1 and SD2 of Erase Block 2 extend across the entire width of the array and contact the common source regions of cells 10 on either side of the source line segments. Thus, for example, source line segment SD1 of erase Block 2 is connected to the common source regions of cell 10A and 10B in the rows associated with word lines WL11 and WL10, respectively, and to all of the other cells located in those rows. Doped source line segment SD2 is connected to the common source regions in the cell 10 located in the two rows associated with word lines WL8 and WL9.

The two doped source line segments SD1 and SD2 of Erase Block 2 are connected to a vertical metal source line SL2 by way of contacts 36A and 36B. Metal source line SL2 extends over Erase Blocks 0 and 1 and out of the array 34 so that the sources of the cells in Erase Block 2 can be connected to a source line decoder circuit (not depicted) external to the array 34. Line SL2 does not make contact with either erase Block 0 and 1.

Figure 5:
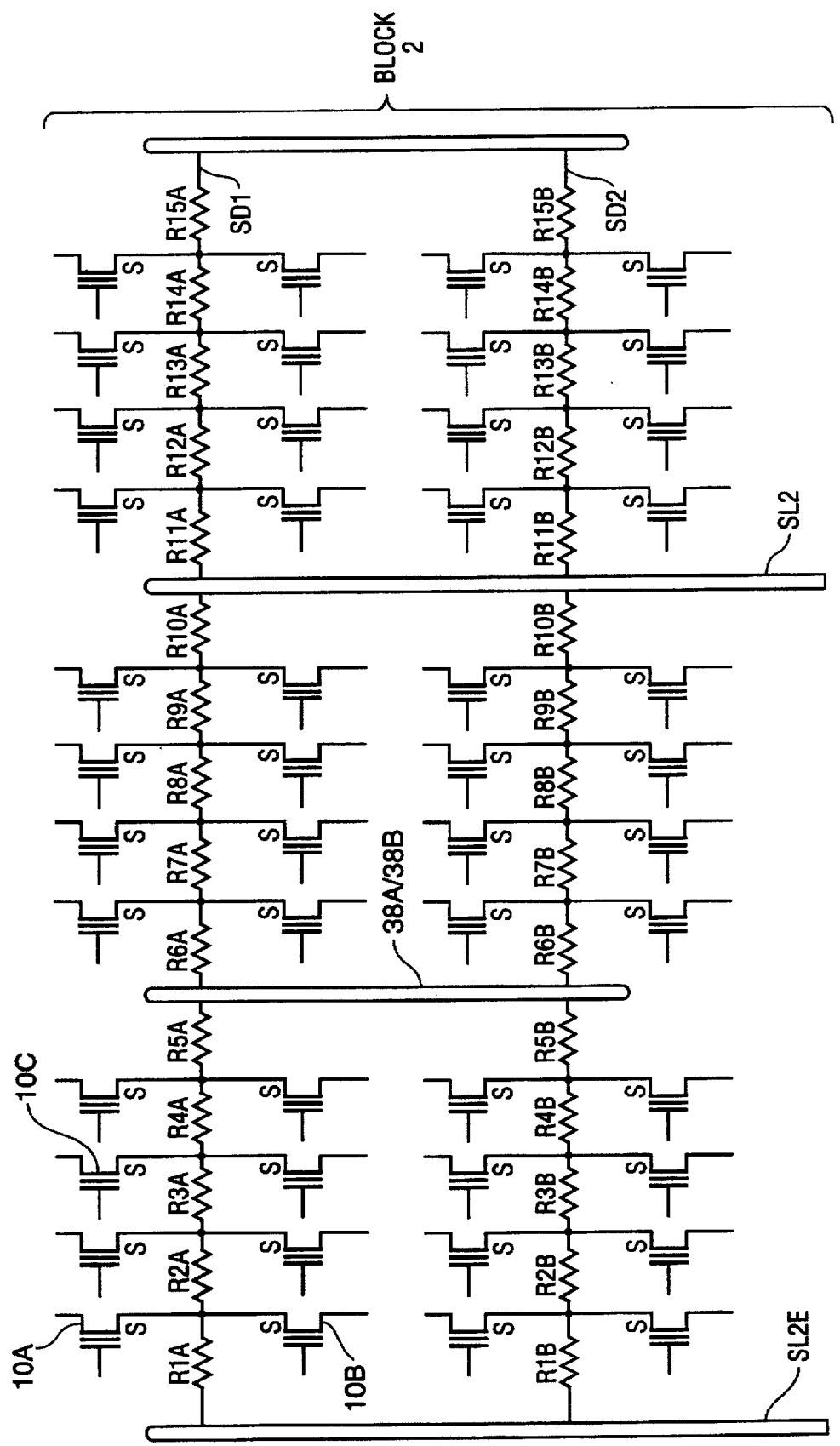
FIG. 5 is a schematic diagram of showing an equivalent circuit for one of the erase blocks of the FIG. 4 array arrangement.

FIG. 5 is a schematic diagram showing the series resistances associated with the doped source lines SD1 and SD2 of Erase Block 2. Source line SD1 is represented by series-connected resistors R1A-R15A of equal value, with each resistor representing the source line resistance between adjacent cell columns. Similarly, resistors R1B-R15B represent the source line resistance of doped source lines SD2. In order to reduce the adverse effects of such resistance, the doped segments are periodically connected together a fixed number of bit lines by a vertical metal track. In the FIG. 4 embodiment, the doped segments SD1 and SD2 of erase Block 2 are connected together at one location by metal source line SL2 intermediate bit lines BL7 and BL8. The diffused segments SD1 and SD2 are further connected together at a location intermediate bit lines BL3 and BL4 by a pair of metal source straps 38A and 38B. Preferably, the doped source lines are connected together by either a metal source line or a metal source strap every N number of bit lines, with N being equal to four in the FIG. 4 embodiment. Although two straps may be used at one location to simplify fabrication, the two straps are electrically equivalent to a single strap so that the second strap may be deleted. Similarly, source strap 38C is positioned adjacent metal source line SL2 and thus also does not function to reduce the resistance, but is present to simplify the manufacturing process.

As can be seen in FIGS. 4 and 5, each erase block is provided with multiple source lines. The metal source lines extend out from the array 34 and are electrically connected together and to a source line decoder circuit (not depicted) which permits a selected erase block to be erased. As can be seen in FIGS. 4 and 5, Erase Block 2 includes the previously-described metal source line SL2 and an edge metal source line SL2E which is electrically connected to the two doped source lines SD1 and SD2 at the edge of array 34. The edge metal source lines SLE2 is electrically connected to metal source line SL2 outside the array, typically near the source line decoder circuit.

Erase Block 1 (FIG. 4) includes four rows of cells 10 associated with word lines WL4–WL7 and a pair of doped source lines SD3 and SD4. Lines SD3 and SD4 are connected together at one location intermediate bit lines BL3 and BL4 by a metal source line SL1. Metal source line SL1 extends over, but does not make electrical contact with, erase Block 0 and extends out of the array 34 for connection to the source line decoder circuitry external to the array 34.

Erase Block 1 further includes a metal source strap 38D located four bit lines over from metal source line SL1 and adjacent to bit line BL0. A further metal source strap 38E is located four bit lines away in the opposite direction, intermediate bit lines BL7 and BL8. Another metal source strap 38F is located another four bit lines away adjacent bit line BL11. Finally, a second metal source line SL1E, located at the edge of the array, functions to connected the doped source lines SD4 and SD5 together and to the source line decoder external to the array.

Erase Block 0 includes a pair of doped source lines SD5 and SD6 which are associated with four rows of cells 10. Each row has an associated word line WL0–WL3. Block 0 includes the same twelve columns as are present in Blocks 1 and 2 including the columns associated with bit lines BL0–BL11. A first metal source line SL0A is connected to the doped source line segments SD5 and SD6 at a location adjacent bit line BL0. A second metal source line SL0B located adjacent bit line SL0B is located at the other end of the array adjacent bit line BL11. Since the two metal bit lines SL0A and SL0B are located at the opposite ends of that array, it is not necessary to provide edge metal source lines, such as lines SL0E and SL1E used in connection with Blocks 0 and 1. Erase Block 0 includes a first metal source strap 38G located adjacent bit line BL3 and a second metal source line 38H, both interconnecting the diffused source lines SD5 and SD6.

As previously noted, the metal lines of the array occupy a significant amount of chip area. Thus, in order to reduce the amount of area occupied by the metal source lines and the metal source straps, the two lines and straps are positioned in vertical alignment where possible. By way of example, metal source line SL1 and metal source strap 38B are in alignment so that the horizontal area occupied is reduced. As a further example, metal source line SL0A and metal source strap 38D are aligned so as to conserve space.

The FIG. 5 diagram of Erase Block 2 illustrates that no cell is more than two bit lines BLN away from either metal source line going to the outside (as SL2E or SL2) or a strap (as 38A or 38B). This limits the maximum source line resistance for a worst case cell 10, such as cell 10C, to less three time R, where R is equal to the value of any of the individual source line resistances R1A–R15A. The metal source straps 38 interconnecting the doped source lines SD1 and SD2 function to further reduce the maximum source line resistance. The metal source straps and the metal source lines are located such that they alternate a fixed number of bit lines, such as four bit lines in the FIG. 4 and 5 embodiment.

Figure 6:
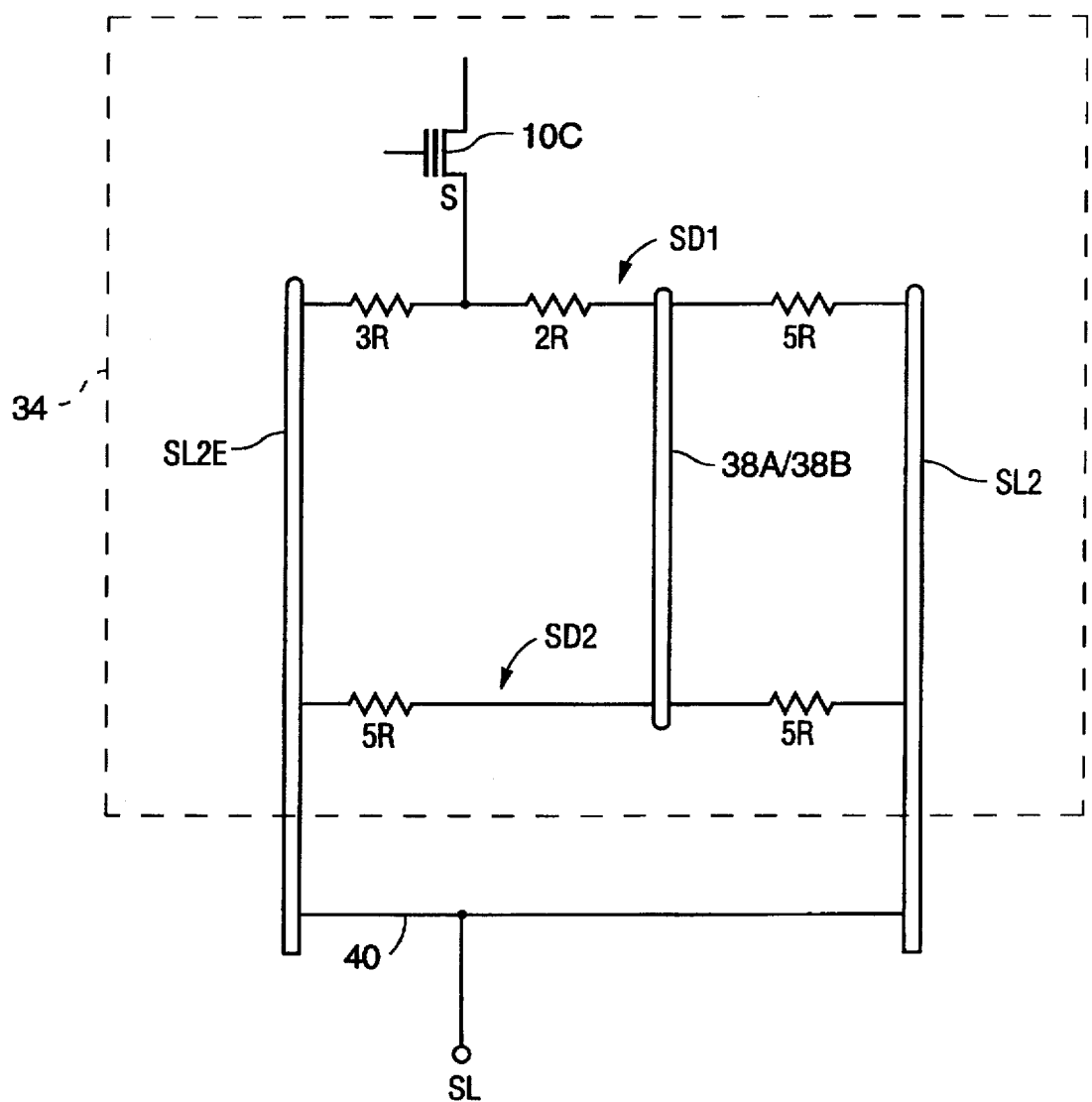
FIG. 6 is a schematic diagram showing an equivalent circuit for determining the worst case source line resistance for an exemplary cell of the FIG. 4 array arrangement.

It can be seen from examination of the FIG. 5 array that cell 10A will have a source line resistance not greater than the value of equivalent resistor R1A. Other cells 10 of the array will have a greater resistance, with the overall performance of the array being limited by the cell with the worst case resistance. FIG. 6 is schematic diagram of an equivalent circuit of a portion of erase Block 2 of the FIG. 4 and 5 array. Exemplary cell 10C is shown since this cell is located such that it is among the cells which will have the largest source line resistance. Cell 10C is disposed three equivalent resistances (R1A–R3A) away from metal source line SL2E hence the resistor value 3R is shown connected between the cell and the source line. Cell 10C is further disposed two equivalent resistances (R4A–R5A) away from metal source strap 38A/38B hence the value 2R shown connected to the cell. The strap 38A/38B is shown connected to the metal source line SL2 by way of parallel resistors 5R which represent equivalent resistors R6A–R10A and R6B–R10B, respectively. Finally, equivalent resistor 5R representing resistors R1B–R5B, is shown connected metal source line SL2E and metal strap 38A/38B. The two metal source lines SL2E and SL2 are connected together by a line 40 external to array 34.

The total effective resistance between the source of cell 10C and the source line SL for erase Block 2 can readily be calculated using simple arithmetic. The total effective resistance is equal to parallel combination of 3R||(2R+5R/3). This give an effective approximate equivalent source resistance of 1.6R. If the metal source strap were deleted, the worst case cell would be cell 10E, with an equivalent source resistance of approximately 2.5R.

Figure 7:
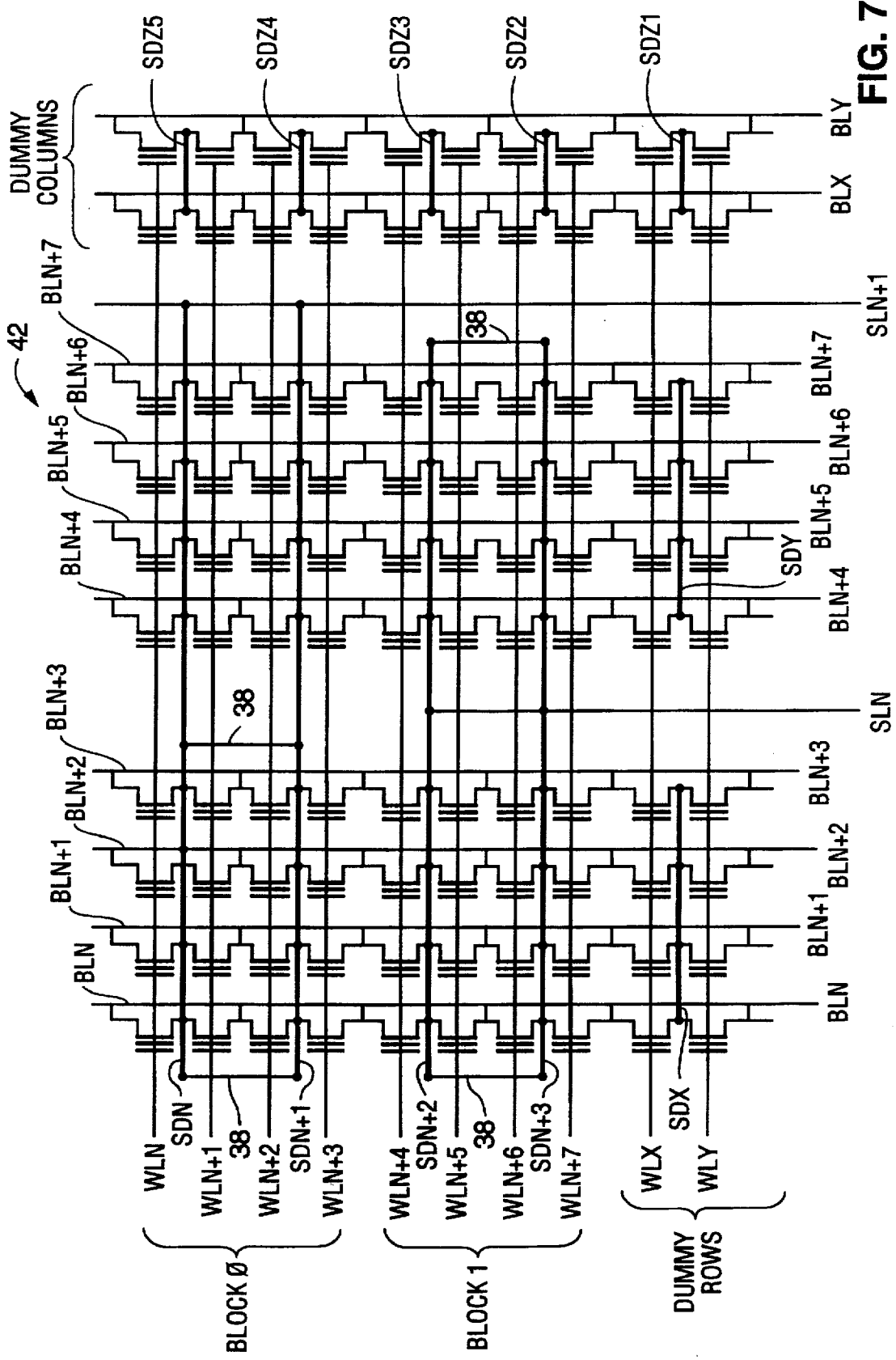
FIG. 7 is a schematic diagram of another embodiment of a segmented flash memory cell array arrangement.

FIG. 7 depicts a portion of another array 42 in suitable for use in the present invention. Only a corner portion of the array is depicted, including a portion of an Erase Block 0 and an Erase Block 1. Erase Block 1 has one metal source line SLN depicted, with there being additional metal source lines also associated with Block 1. Erase Block 0 has one metal source line SLN+1 depicted, with there being additional metal source lines associated with Block 1. Those lines, which extend over Block 0 but do not make contact to Block 0, are also not depicted in that portion of array 42 shown in FIG. 7.

As was the case with the FIG. 4 array, the doped source lines of each erase block are connected together every four bit lines by either a metal source line or by a metal source strap. By way of example, erase Block 0 has two associated doped source lines SDN and SDN+1 which are connected together by metal straps 38 and source lines SLN+1 every four bit lines.

In a typical flash cell array, cells located at the edge of the array are much more subject to processing variations than the cells not located at the edge. Because of this, it is common to refrain from using the cells at the array edge. Such cells, which extend around the perimeter of the array, are sometimes referred to as dummy cells. Array 42 is surrounded by dummy cells including the two columns of cells depicted in FIG. 7 at one edge of the array and two columns not depicted at the opposite edge of the array. The depicted columns are associated with bit lines BLX and BLY. In addition, array 42 includes two rows of dummy cells located at opposite edges of the array, including two rows not depicted and two rows shown in FIG. 7. The depicted rows are associated with word lines WLX and WLY.

The dummy cells have doped source lines which interconnect the source regions of the dummy cells. The doped source lines include lines SDZ1–SDZ5 of the two dummy columns and lines SDX and SDY of the two dummy rows. Typically, the bit lines BLX and BLY are not accessed since the dummy cells are not supposed to be programmed. If the source lines of the dummy cells, such as source line SDZ5 were to be connected to the source lines of the array, such as line SDN, the dummy cells would be erased when the array is erased. Since the dummy cells cannot be programmed but would otherwise be erased, the dummy cells are likely to become overerased so that they will conduct cell current even when the associated word line is grounded. The flow of current through an overerased cell will usually prevent proper operation of the array. In order to ensure proper operation of the array, the doped source lines of the dummy rows should not be in electrical contact with the doped source lines of the corresponding rows of the functional cells of the array. By way of example, diffused source line SDN of the rows associated with word lines WLN and WLN+1 does not extend to the diffused source line SDZ5. In addition, the dummy cells located in the dummy rows would have a tendency to be erased when functional cells located in the same column are repetitively programmed. This phenomenon is sometimes referred to as bit line disturb where the dummy cells sharing a bit line with functioning cells would have some tendency to become overerased and thus become leaky. In order to reduce the likelihood of this occurring, the length of the source lines of the dummy cells are made short so as to minimize the possibility of a leakage path between bit lines. By way of example, source lines SDX and SDY of the two dummy rows are not connected so as to minimize any adverse effects of bit line disturb.

Figure 8:
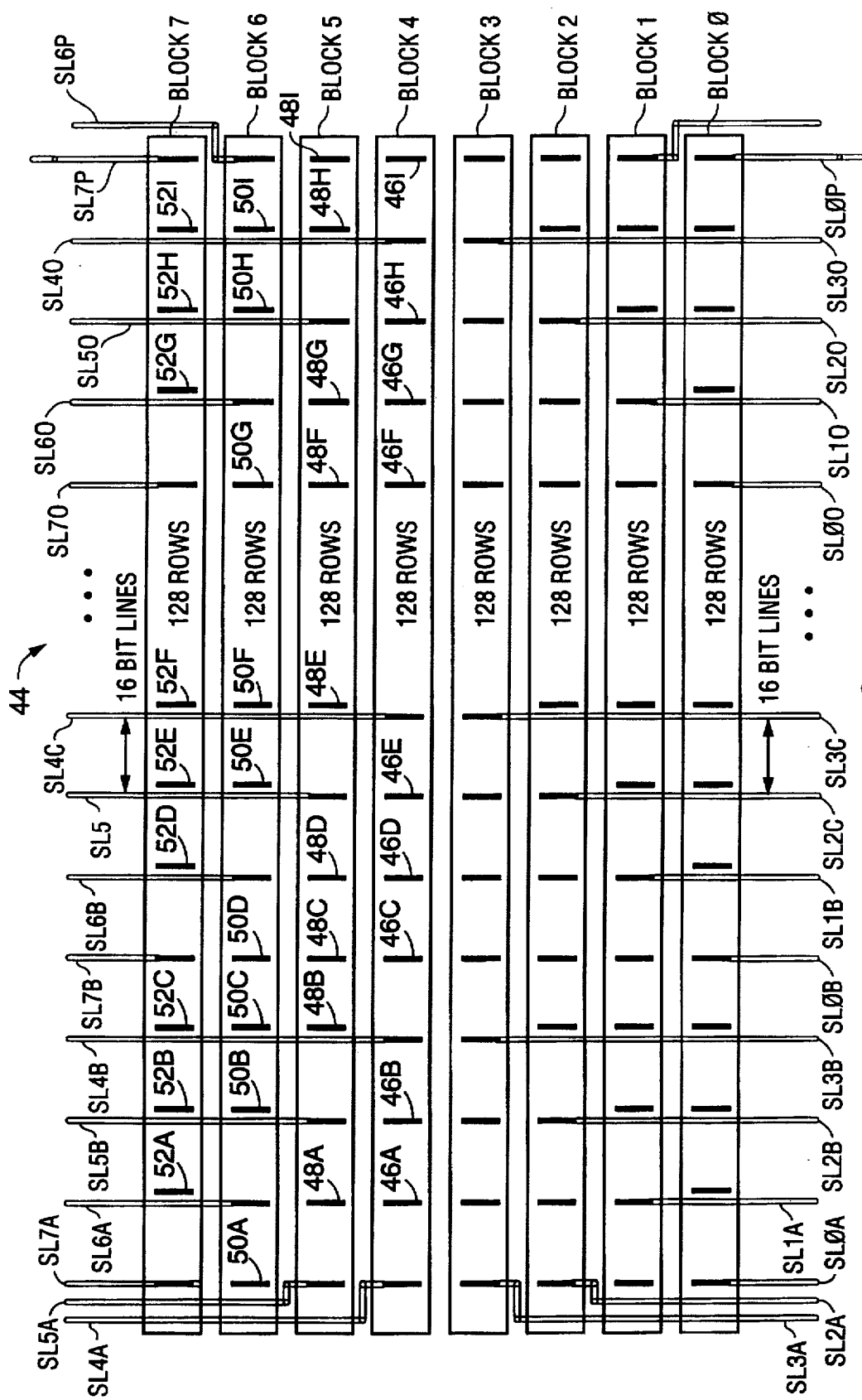
FIG. 8 is a diagram illustrating the layout of a flash memory cell array arrangement having eight separate erase blocks and depicting the location of the metal source connect lines and the metal source straps.

FIG. 8 show a further embodiment of an array 44 in showing essentially only the source line connections. Array 44 is comprised of eight erase Blocks 0–7, with each of the erase blocks having 128 rows of flash cells. Thus, array 44 has a total of 1024 rows of cells. Array 44 also has 1024 columns of cells so that the total array capacity is one Megabit. Each erase block can be considered an array of cells having 128 rows and 1024 columns. As can be seen from FIG. 8, erase Blocks 0–3 and erase Blocks 4–7 are mirror images of one another.

Each of the erase blocks has several vertical metal source lines SLN which are electrically connected to all of the horizontal doped source lines (not depicted) of the erase block. The metal source lines SLN are provided a minimum of every 64 bit lines for each erase block, with the variation being due to the presence of edge metal bit lines. By way of example, Erase Block 4 will have 16 metal source lines, including lines SL4A, SL4B, SL4C ... and SL4O. Each of the erase blocks also includes several metal source straps which electrically connect all of the diffused source lines of the erase block together. Erase Block 4 includes, for example, metal straps 46A–46L. The metal source straps are internal to the erase blocks and do not extend past the edges of the associated erase block. There are typically three metal source straps intermediate adjacent metal source lines so that there is either a metal source strap or a metal source line located every 16 bit lines of each erase block.

The metal source lines SL4A–SL4O of Erase Block 4 extend over Erase Blocks 5–7 and away from array 44 where they are connected together to form a common source line for Erase Block 4. The metal source lines from Block 4 extend over the other blocks along a path which is parallel with the bit lines of the block and orthogonal to the word lines. As will be explained, the metal source lines from Erase Block 4 (and the other erase blocks) are coupled to a source lined decoder circuit external to array 44 (not depicted).

Erase Block 5 includes metal source lines SL5A–SL5 which are also spaced apart about every 64 bit lines. The metal source lines of Erase Block 5 extend over Erase Blocks 6 and 7 and out of array 44 where they are electrically connected to the source line decoder. Erase Block 5 also includes metal source straps 48A–48L. The straps, like the straps of Block 4, interconnect all of the horizontal doped source lines of Block 5. There are typically three metal source straps intermediate adjacent metal source lines, with there being either a metal source line or a metal source strap every sixteen bit lines.

Erase Blocks 6 and 7 include metal source lines (SL6A–SL6A and SL7A–SL7P, respectively) and metal source straps (50A–50I and 52A–52I, respectively) which are positioned in the same manner as the lines and straps in Blocks 4 and 5. Note that the location of the metal source straps are selected so that they generally align with the metal source lines of adjacent erase blocks. By way of example, metal source straps 52B, 50B, and 46B of Erase Blocks 7, 6 and 4, respectively, are generally aligned with metal source line SL5B of Block 5. As a further example, metal source straps 46C, 48C and 50D are generally aligned with metal source line SL7B.

As previously noted, Blocks 0–3 and Blocks 4–7 are arranged so that they are mirror images of one another. The metal source lines of Blocks 0–3 all extend toward to lower edge of array 44 and the metal source lines of Blocks 4–7 all extend in the opposite direction towards the top edge of the array. By dividing the erase blocks into two groups of blocks with each group of blocks having metal source lines extending in the opposite direction, a reduction in the amount of chip area occupied by the metal source lines is reduced. By way of example, metal source line SL3C of Erase Block 3 and metal source line SL4C of Erase Block 4 can be made to occupy the same vertical path on array 44 since they extend in opposite directions.

Figure 9:
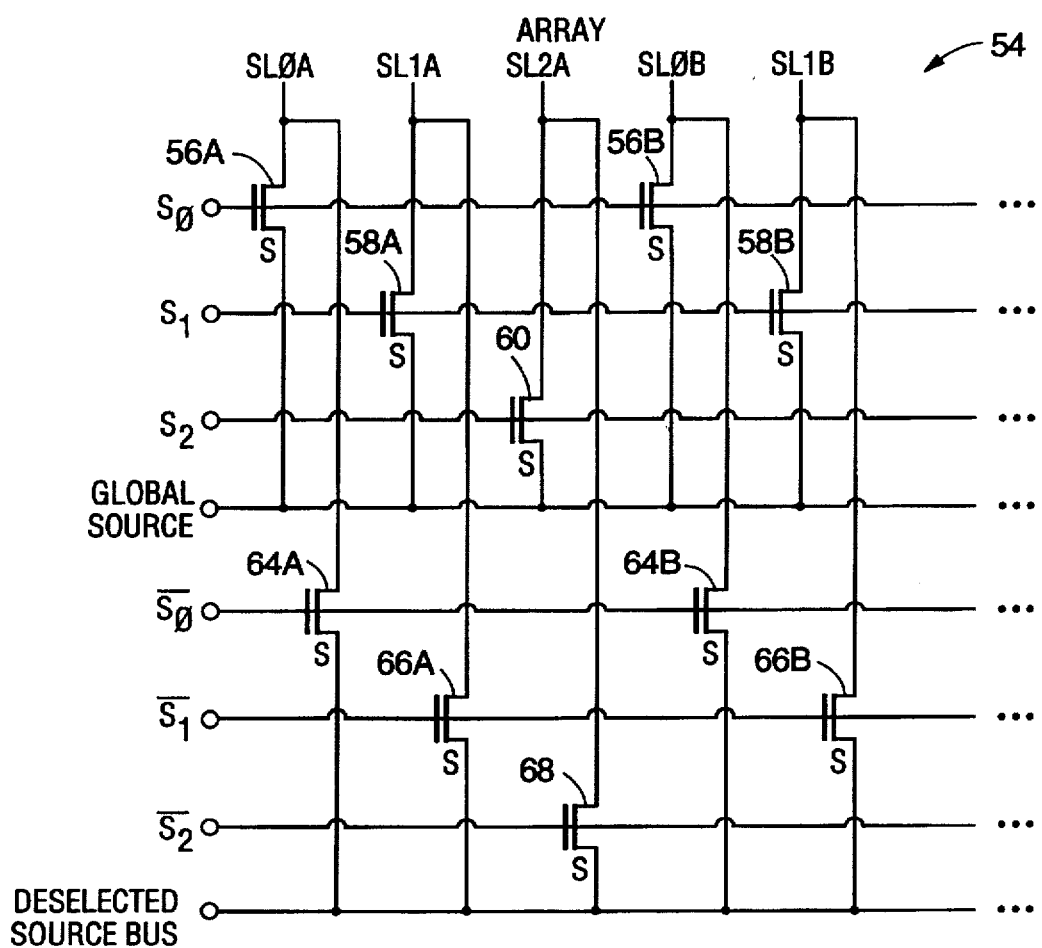
FIG. 9 is a schematic diagram of one embodiment of an erase source decoder circuit for use with an array having three erase blocks.

FIG. 9 is a schematic diagram of an exemplary section of one embodiment of an erase source decoder circuit 54 which can be used in connection with an array having a total of three erase blocks. Circuit 54 includes a set of N channel source line decode transistors 56, 58 and 60 connected to the respective source lines of the array. The function of the decode transistors is to connect the source lines coming from a common selected erase block of the array to the same desired potential/condition and to connect the source lines from the deselected erase blocks to a desired potential/condition.

By way of example, the source lines from Erase Block 0, including depicted lines SL0A and SL0B are connected to decode transistors 56A and 56B, respectively. Transistors 56A and 56B, and other decode transistors not depicted which are connected to any additional source lines of Erase Block 0 and have their gates connected to a common line which carries control signal $S_0$. Source lines from Erase Block 1, including depicted lines SL1A and SL1B, are connected to decode transistors 58A and 58B, respectively. Transistors 58A and 58B, and any other transistors not depicted which are connected to any additional source lines of Erase Block 1, have their gates connected to a common line which carries control signal $S_1$. Erase Block 2 has one source line SL2A depicted in FIG. 9 which is connected to transistor 60. A control line carrying signal $S_2$ is connected to the gate of transistors 60 and to the gate of any additional decode transistors which receive other source lines of Erase Block 2. All of the transistors of source decoder circuit 54 controlled by control signals $S_0$, $S_1$ and $S_2$ have their source electrodes connected to a common Global Source line.

Each of the source lines of Erase Blocks 0, 1 and 2 are also connected to separate N channel transistors 64, 66 and 68 which function to selectively connect the source lines to a common Deselected Source Bus. As will be explained, the Deselected Source Bus may be set to some voltage or may be grounded. By way of example, transistors 64A and 64B are connected to source lines SL0A and SL0B of Erase Block 0. The gates of transistors 64A and 64B are controlled by signal $\bar{S}_0$ which is the complement of signal $S_0$. Source lines SL1A and SL1B of Erase Block 1 are connected to transistors 66A and 66B, respectively, with transistors 66A and 66B having their gates connected to a common line which carries signal $\bar{S}_1$, the complement of signal $S_1$. Transistor 68 is controlled by signal $\bar{S}_2$, the complement of signal $S_2$, and is connected to source line SL2A of Erase Block 2.

Table 2 below shows the manner in which the source decoder circuit 54 is controlled in basic memory operations. In a memory read operation, all of the source lines of all of the erase blocks are to be connected to ground. Thus, as can be seen from Table 2, signals $S_0$, $S_1$ and $S_2$ are made active (connected to voltage $V_{cc}$) so that transistors 56A, 56B, 58A, 58B and 60 are all rendered conductive. The Global Source signal is brought to ground level so that all of the source lines of the array (SL0, SL1 and SL2) are at ground level.

TABLE 2

ERASE SOURCE DECODER

| SIGNAL | READ (BLOCK 0) | PROGRAM (BLOCK 0) | ERASE (BLOCK 0) |
|---|---|---|---|
| $S_0$ | +5 volts | +5 volts | +12 volts |
| $S_1$ | +5 volts | +5 volts | 0 volts |
| $S_2$ | +5 volts | +5 volts | 0 volts |
| $\bar{S}_0$ | 0 volts | 0 volts | 0 volts |
| $\bar{S}_1$ | 0 volts | 0 volts | +12 volts |
| $\bar{S}_2$ | 0 volts | 0 volts | +12 volts |
| GLOBAL SOURCE | 0 volts | 0 volts | +10 volts |
| SL0 | 0 volts | 0 volts | +10 volts |
| SL1 | 0 volts | 0 volts | 0 volts |
| SL2 | 0 volts | 0 volts | 0 volts |

Table 3 below shows the conditions for the other portions of the array, including word lines and bit lines, for carrying out memory read, program and erase operations. Although, the erase mechanism described utilizes a grounded gate, negative gate erase could also be used as will be described. As can be seen from Tables 2 and 3, and as noted above, in memory read operations, the selected source line (the source lines of the erase block containing the cells to be read) are grounded as are the deselected source lines (the source lines of the other erase blocks). This is accomplished by setting signals S0, S1 and S2 to +5 volts which causes transistors 56A, 58A, 60, 56B and 58A to be conductive thereby connecting all three source lines SL0, SL1 and SL2 to the Global Source line. The Global Source line is at ground potential so that all of the source lines are grounded. Signals $\bar{S}_0$, $\bar{S}_1$ and $\bar{S}_2$ are all at ground potential during read operations so that transistors 64A, 66A, 68, 64B and 66B are off.

TABLE 3

| FUNCTION | READ | PROGRAM | ERASE |
|---|---|---|---|
| SELECTED WORD LINE | +5 volts | +11 volts | N/A |
| DESELECTED WORD LINE SELECTED BLOCK | 0 volts | 0 volts | 0 volts |
| DESELECTED WORD LINE DESELECTED BLOCK | 0 volts | 0 volts | 0 volts |
| SELECTED BIT LINE | +1 volt | Data = 0 +6 volts Data = 1 0 volts | N/A |
| DESELECTED BIT LINE | float | float | float |
| SELECTED SOURCE LINE | 0 volts | 0 volts | +10 volts |
| DESELECTED SOURCE LINE | 0 volts | 0 volts | 0 volts |

In addition, the word line associated with the cells being read (the selected word line) is connected to +5 volts and all of the other word lines in the array are grounded. The bit lines of the cells being read (eight cells if the memory word length is eight bits) are connected to a small positive voltage such as +1 volt. All other bit lines of the array are left floating, as can also be seen from Table 3. This combination of conditions will cause the selected cells to either conduct or not conduct current based upon their programmed state.

In order to program a cell (or cells), a relatively large positive voltage of +11 volts is applied to the word line associated with the cell being programmed. All of the other word lines of the array, including those in the same erase block, are grounded. The bit line of the cell to be programmed is connected to +6 volts. If the cell is to be left in the erased state, the bit line is connected to +1 volt. As shown in Table 3, the deselected bit lines are all left floating during programming operations.

As previously noted, one feature of the present invention is to provide an array which contains separate erase blocks which can be independently erased. Table 2, above, shows the conditions of the erase source decoder when an exemplary erase block, Erase Block 0, is being erased. The Global Source line is set to +10 volts. In addition, signal $S_0$ is set to +12 volts so that transistors 56A and 56B have sufficient gate voltage to apply the +10 volts present on the Global Source line to the source lines SL0A and SL0B associated with the selected erase block, Erase Block 0. The deselected source lines, those associated with the other erase blocks, are all grounded by setting signals $\bar{S}_1$ and $\bar{S}_2$ to +12 volts thereby turning on transistors 66A, 68, 66B. In addition, the Deselected Source Bus is grounded so that the deselected source lines SL1A, SL1B and SL2A are all at ground potential.

Table 3, above, shows the conditions of the remainder of the array in erase operations. All of the word lines, including those of the erase block being erased and the other erase blocks, are grounded. In addition, all of the bit lines of the array are left floating. Under these conditions, all of the cells in Erase Block 0 will be erased.

Table 3 illustrates one set of conditions for reading, programming and erasing a flash array. In that example, a cell is erased by connecting the selected source line to +10 volts, the selected word line to ground and floating the selected bit line. As previously noted, negative gate erase techniques could also be used where a negative voltage is applied to the word line of the cells being erased. That voltage is typically −10 volts to −17 volts as previously described. The bit line is left floating and a relatively small voltage $V_A$, such as +5 volts, is applied to the source line of the erase block. As will be explained, the deselected source lines are left floating rather than being grounded as is done in conventional arrays having separate erase blocks. By floating the deselected source lines, certain defects can exist in one erase block which do not interfere with the operation of the remaining erase blocks.

Figure 10:
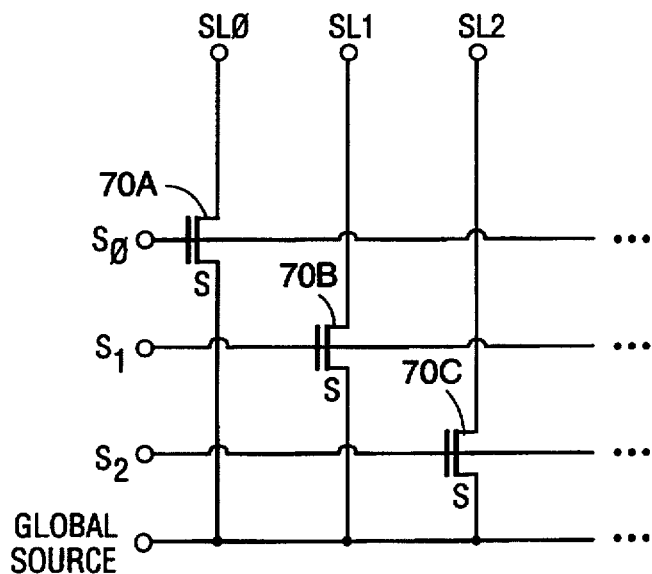
FIG. 10 is a schematic diagram of an alternative erase source decoder circuit in accordance with the present invention.

FIG. 10 depicts an alternative source line decoder in accordance with the present invention. Table 4 below shows the various signals used in the FIG. 10 decoder, when the decoder is used in connection with an array utilizing negative gate erase. Referring to FIG. 10, each erase block has a separate source line SL0, SL1, SL2 connected to a separate transistors 70A, 70B and 70C, respectively of the decoder. Transistors 70A, 70B and 70C are controlled by signals $S_0$, $S_1$ and $S_2$, respectively. In the event the erase blocks have more than one source line, additional decode transistors are included. Thus, for example, if Erase Block 0 were to have additional source lines, they would each be connected to a transistor controlled by signal $S_0$.

TABLE 4

ERASE SOURCE DECODER

| SIGNAL | READ (BLOCK 0) | PROGRAM (BLOCK 0) | ERASE (BLOCK 0) |
|---|---|---|---|
| $S_0$ | +5 volts | +11 volts | +11 volts |
| $S_1$ | 0 volts | 0 volts | 0 volts |
| $S_2$ | 0 volts | 0 volts | 0 volts |
| GLOBAL SOURCE | 0 volts | 0 volts | $V_A$ |
| SL0 | 0 volts | 0 volts | $V_A$ |
| SL1 | float | float | float |
| SL2 | float | float | float |

As can be seen from Table 4, when cells in Erase Block 0 are to be read, signal $S_0$ is set to +5 volts thereby turning on transistor 70A (and any other transistors that may be connected to a source line of Erase Block 0). Signals $S_1$ and $S_2$ remain at ground level so that the transistors connected to the remaining erase blocks, including transistors 70B and 70A, are left off. Thus, the source lines of all of the deselected erase blocks are floating. Conducting transistor 70A will connect the source line SL0 of Erase Block 0 to the Global Source line which is, in turn, connected to ground. A positive voltage of +5 volts is connected to the word line associated with the cells being read and the bit lines are connected to a small positive voltage of typically +1 volts. This will cause current to flow or not to flow in the cells being read depending upon whether the cells are in an erased or programmed state. Table 3, above, shows the conditions for the deselected word lines and bit lines during read operations.

In a programming operation where cells in Erase Block 0 are to be programmed, Table 4 indicates that transistor 70A is turned on and transistors 70B and 70C are left off. The Global Source line is set to ground potential so that transistor 70A will cause the source line SL0 to be at ground potential.

The deselected source lines SL1 and SL2 will be floating. The word line associated with the cells being programmed is set to a relatively large positive voltage of typically +11 volts. Since this voltage (+11 volts) is generated for programming, the voltage is available for generating signal $S_0$ used to on transistor 70A. Signal $S_0$ could also be +5 volts since transistor 70A is switching at a voltage near ground potential. Further, the bit line associated with the cells to be programmed will be set to a medium level voltage such as +6 volts. If the cell is to be left in the erased state, the associated bit line is grounded. This combination of conditions will permit the selected cells of Erase Block 0 to be programmed.

Continuing, Table 4 indicates that all the cells of Erase Block 0 are erased by setting signals $S_0$, $S_1$ and $S_2$ such that transistor 70A of the FIG. 10 erase decoder is made conductive and the remaining transistors 70B and 70C are off. The Global Source line is set to a relatively low positive voltage $V_A$ which is typically approximately +5 volts or some other value which will not be so large as to result in cell voltage break down. Thus, source line SL0 of Erase Block 0 will be at voltage $V_A$ and the source lines of the remaining erase blocks, lines SL1 and SL2 will be floating. The word lines of Erase Block 0 are all set to a relatively large negative voltage, such as −10 volts, and the bit lines of the array are all left floating. This will result in all of the cells of Erase Block 0 being erased by way of the previously-described negative gate erase technique.

It is possible that a failure of a cell in one erase block will adversely affect operation of the remaining erase blocks. Under certain conditions, a flash cell will conduct current when it should be non-conducting. By way of example, if a cell has been over erased, the cell will have a negative threshold voltage so that the cell will conduct even when the gate-source voltage is 0 volts. Other conditions may occur which will cause a cell to be "leaky" and conduct current when the cell should be non-conductive. When a cell of a deselected erase block is improperly conducting current, the cell has a tendency to clamp the bit line voltage to the source voltage. This can cause the bit line voltage to approach ground potential should the source lines of the deselected erase blocks be set to ground potential as is illustrated in Tables 2 and 3, above. Since the bit lines are common to all of the erase blocks in an array, a defective cell in one block will have a tendency to interfere with the reading, programming and erasure of the other blocks. By floating the source lines of deselected erase blocks during program or read, as shown in Table 4, the adverse affects of a leaky or over erased cell in the deselected blocks on the cells of selected erase blocks will be greatly reduced.

Figure 11:
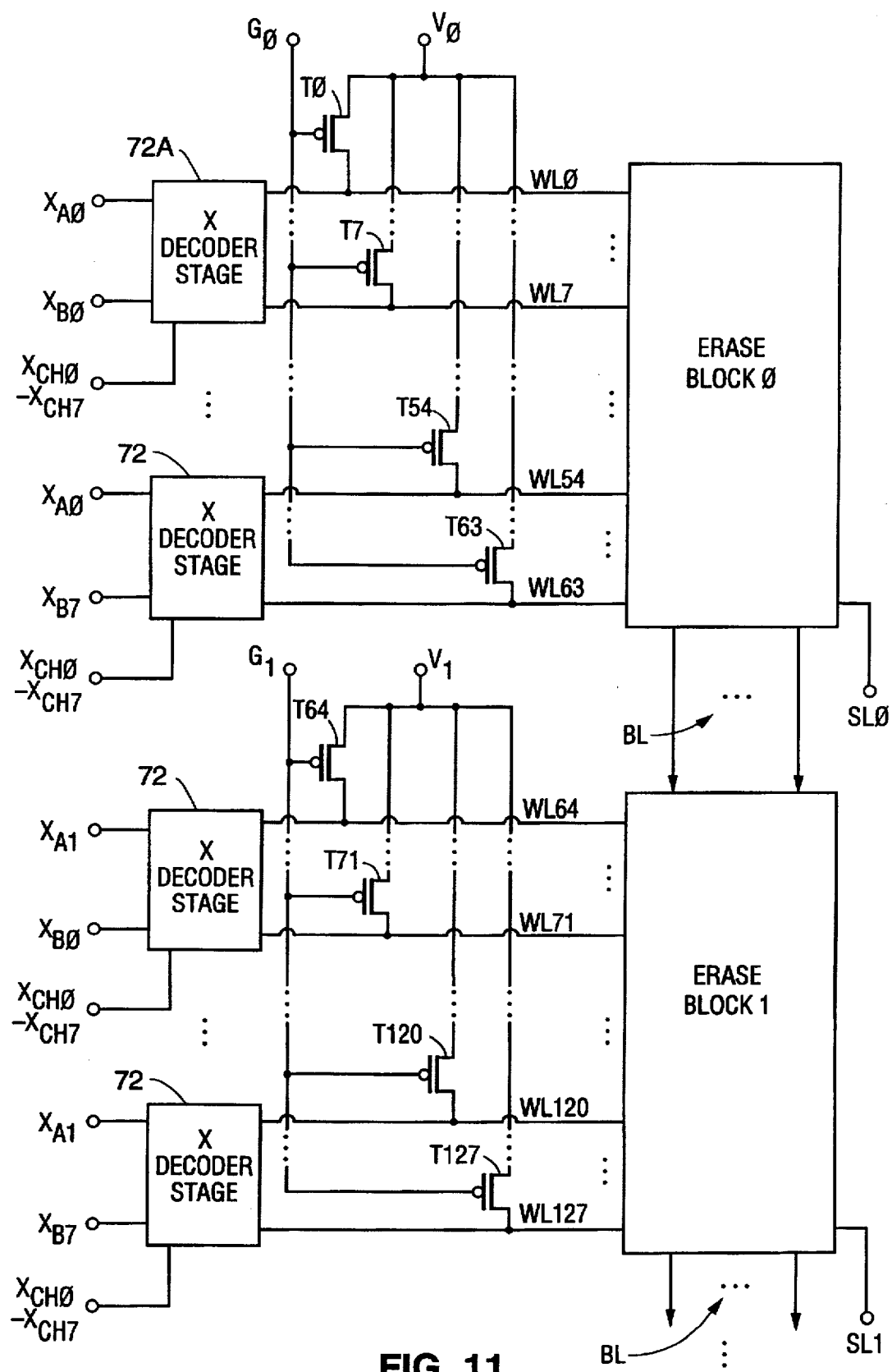
FIG. 11 is a block diagram of a segmented flash array arrangement utilizing negative gate erase techniques.

FIG. 11 depicts a flash cell array arrangement using word line control circuitry for carrying out negative gate erase. Exemplary Erase Blocks 0–1 are depicted, with there being a total of eight erase blocks, including Erase Blocks 2–7 which are not shown. Each erase block has sixty-four word lines WL, a set of bit lines BL common to all of the erase blocks and separate source lines (not depicted). The word lines are grouped in eights, with each group of eight being connected to a separate X Decoder Stage 72. The functionality provided by X Decoder Stages 72 is conventional. By way of example, FIG. 6 of the previously noted U.S. Pat. No. 5,077,091 discloses a decoder stage which provides the same output signals as provided by X Decoder Stages 72. Exemplary X Decoder Stage 72A is connected to word lines WL0–WL7. There are a total of 512 word lines WL0–WL511, with word lines WL0–WL63 being associated with Erase Block 0 and word lines WL64–WL127 being associated with Erase Block 1 and the remaining word lines WL128–WL511 being associated with the remaining six erase blocks that are not depicted.

Each of the word lines WL0–WL511 also has a separate respective P channel erase transistor T0–T511 connected to it, with the transistors associated with one of the erase blocks being controlled by a common control signal. Thus, erase transistors T0–T63 of Erase Block 0 have their gates connected to a line that carries control signal G0 and erase transistors T64–T127 of Erase Block 1 have their gates connected to a common line that carries control signal G1. In addition, all of the erase transistors associated with an erase block have their sources connected to a common voltage line. Thus, for example, erase transistors T0–T63 are all have their sources connected to a common line that carries a voltage $V_0$.

Figure 13:
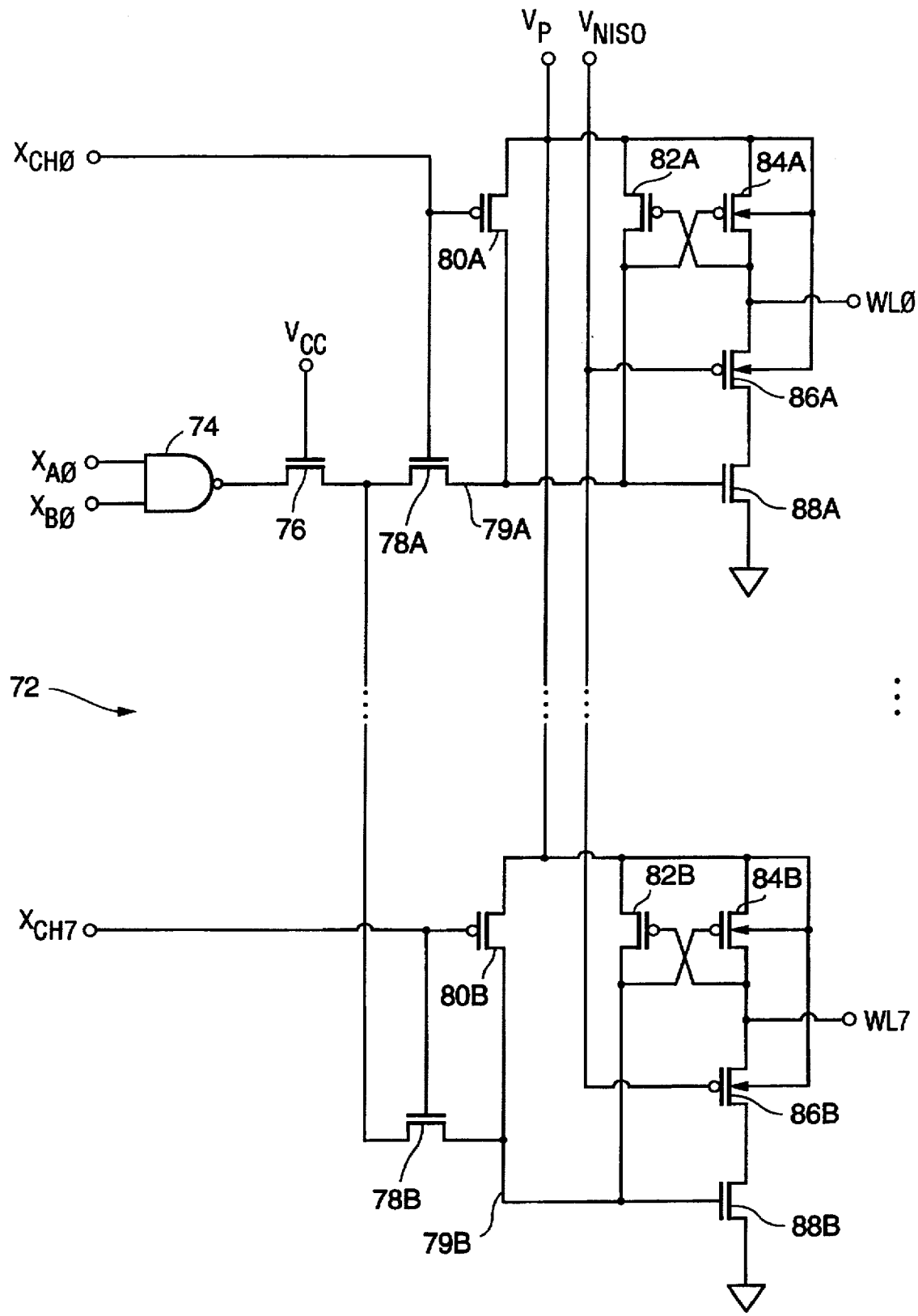
FIG. 13 is a schematic diagram of one of the X Decoder Stages used in the array arrangements of FIGS. 11 and 12.

The details of the X Decoder Stages 72 of FIG. 11 are shown in FIG. 13. As will be explained in greater detail, the X Decoder Stages 72 provide outputs which are either at a positive voltage equal to the X Decoder Stage 72 supply voltage $V_p$, ground potential or a high impedance (at least more than 10k Ω). The high impedance state of the X Decoder Stages 72 is used when the erase transistors T0–T511 function to apply a negative voltage to the word lines of an erase block during an erase operation, as will be explained in greater detail.

The conditions for carrying out read, program and erase operations on the FIG. 11 array arrangement are set forth in Table 5, below. Erase Block 0 is the selected erase block in the Table 5 example. As can be seen from Table 5, if a memory read operation is to occur in Erase Block 0, all of the control signals connected to the gates of the P channel erase transistors T0–T127 (and the erase transistors T128–T511 not depicted) are connected to a positive voltage of +5 volts. That includes signal $G_0$ associated with the selected Erase Block 0 and signal $G_1$ associated with the deselected Erase Block 1. In addition, the voltages $V_0$ and $V_1$ applied to the drains of the P channel erase transistors are all set to +5 volts. The positive voltages applied to the erase transistors causes the transistors to be non-conductive. Accordingly, the state of the word lines will be determined by the X Decoder Stages 72 during memory read operations.

TABLE 5

| FUNCTION | READ | PROGRAM | ERASE |
|---|---|---|---|
| $G_0$ | +5 volts | +11 volts | −12 volts |
| $V_0$ | +5 volts | +11 volts | −10 volts |
| $G_1$ | +5 volts | +11 volts | 0 volts |
| $V_1$ | +5 volts | +11 volts | 0 volts |
| X-DECODER SUPPLY $V_P$ | +5 volts | +11 volts | 0 volts |
| WL-BLOCK 0 (SELECTED BLOCK) | selected +5 volts deselected 0 volts | selected +11 volts deselected 0 volts | −10 volts |
| WL-BLOCK 1 (DESELECTED BLOCKS) | 0 volts | 0 volts | 0–$V_T$ |
| SL0 | 0 volts | 0 volts | $V_A$ |
| SL1 (DESELECTED SOURCES) | 0 volts float | 0 volts float | $V_B$ float |
| $V_{NBSO}$ | −2 volts | −2 volts | 0 volts |

Referring again to FIG. 13, further details of the X Decoder Stage 72 will now be described. The entire X Decoder, which is not depicted, functions to receive nine of the sixteen address bits for the array and decodes those address bits so as to select one of the 512 word lines in memory read and programming operations. The remaining address bits for the memory are used by a Y Decoder (not depicted) to select the appropriate bit lines. X Decoder Stages 72 represent the output portion of the X Decoder for the array. Each X Decoder Stage 72 is associated with eight word lines so that there will be a total of sixty-four X Decoder Stages 72, with eight X Decoder Stages 72 being associated with each of the eight erase blocks. The exemplary FIG. 13 circuitry for X Decoder Stage 72A is associated with eight word lines WL0–WL7 of Erase Block 0.

In order to select one of the 512 word lines, each of the X Decoder Stages 72 receives a total of twenty-four predecode signals. These predecode signals are developed by predecoding circuitry (not depicted) which receives the nine address bits supplied to the X Decoder and converts the nine address bits to twenty-four predecode signals, including signals $X_{A0}$–$X_{A7}$, $X_{B0}$–$X_{B7}$ and $X_{CH0}$–$X_{CH7}$. Signals $X_{A0}$–$X_{A7}$ and $X_{B0}$–$X_{B7}$ are used in combinations of two to select one of the sixty-four X Decoder Stages 72. Signals $X_{CH0}$–$X_{CH7}$ are provided to each of the sixty-four X Decode Stages 72 to select one of the eight word lines associated with each stage. By way of example, X Decode Stage 72A of FIG. 13 receives predecode signals $X_{A0}$ and $X_{B0}$ which function to select that stage from the sixty-four stages. Stage 72A also receives predecode signals $X_{CH0}$–$X_{CH7}$ which are used to select one of the eight word lines WL0–WL7 associated with Stage 72A.

The construction and operation of exemplary X Decode Stage 72A of FIG. 13 will now be described since such description is helpful in understanding Table 5. Predecode signals $X_{A0}$ and $X_{B0}$ are connected to the inputs of a NAND gate 74, the output of which is connected to a level shifting pass transistor 76 which will pass any voltage having a magnitude which is below the supply voltage $V_{cc}$ connected to its gate. Pass transistor 76 is, in turn, connected to a total of eight additional pass transistors, including N channel transistor 78A associated with decode circuitry for word line WL0 and including N channel transistor 78B associated with decode circuitry for word line WL7.

Transistor 78A has its gate connected to receive predecode signal $X_{CH0}$, with predecode signal $X_{CH0}$ also being connected to the gate of a P channel transistor 80A. Transistor 80A is connected between transistor 78A and the X Decoder supply voltage $V_p$. Transistors 78A and 80A are connected to a common node 79A which is near ground potential when predecode signals $X_{A0}$, $X_{B0}$ and $X_{CH0}$ are all at a high level, otherwise node 79A is at a high level. Node 79A is connected to the common gate connection of a P channel transistor 84A and an N channel transistor 88A. These transistors form an inverting stage, the output of which is connected to word line WL0. Transistor 84A is connected between the X Decoder supply voltage $V_p$ and the inverting stage output and transistor 88A is connected between the output, by way of a P channel transistor 86A, and the circuit common. As will be explained, transistor 86A functions to protect N channel transistor 88A from the negative voltage which is present on the word line WL0 during erase operations.

In addition to being connected to word line WL0, the output of the inverting stage is connected to the gate of a feedback P channel transistor 82A, with transistor 82A providing positive feedback which pulls the input of the inverting stage, node 79A, towards supply voltage $V_p$ when the output of the inverting stage, WL0, goes low. This ensures that node 79A will be pulled up to a sufficiently high voltage to turn off P channel transistor 84A.

17

The remaining seven sections (only the last section is depicted) of X Decoder Stage 72A for driving word lines WL1-WL7 are also connected to the output of NAND gate 74 and pass transistor 76. Otherwise, the construction of the sections is the same. The seven sections each receive respective ones of predecode signals $X_{CH1}$-$X_{CH7}$, so that one of the eight word lines WL0-WL7 can be selected.

Returning to the description of a read operation (Table 5 and FIG. 11) in connection with Erase Block 0, the signals $G_0$-$G_7$ applied to the gates of all of the P channel erase transistors T0-T127 (and those not depicted) are set to +5 volts. Thus, the transistors will be non-conductive. In addition, the X Decoder supply voltage $V_p$ is set to +5 volts. A read address is decoded causing predetermined predecode signals to become active. Assuming, for example, that a cell associated with word line WL7 is to be read, the predecode signals $X_{A0}$ and $X_{B0}$ will go high thereby selecting X Decoder Stage 72A. This will cause the output of pass transistor 76 to go low (FIG. 13). In addition, predecode signal $X_{CH7}$ will go high thereby turning on pass transistor 78B and causing node 79B to go low. The remaining predecode signals, $X_{CH0}$-$X_{CH6}$ will remain low. Transistor 84B will turn on so as to pull up selected word line WL7 to voltage $V_p$, which is set to +5 volts. Note that voltage $V_{NISO}$ is set to −2 volts (Table 5) thereby causing P channel transistor 86B to be conductive. However, since transistor 88B is off, the word line WL7 voltage will still be +5 volts.

As indicated in Table 5, the deselected word lines in the selected Erase Block 0 are set to ground potential. This is accomplished by the nine bit address causing the X Decoder to set the predecode signals $X_{CH0}$-$X_{CH6}$ to a low value, as previously noted. Thus, for example, signal $X_{CH0}$ will cause transistor 78A to turn off thereby isolating node 79A from the low output of NAND gate 74. Signal $X_{CH0}$ will also cause transistor 78A to become conductive and pull node 79A up to voltage $V_{CC}$ less the threshold voltage of transistor 79A. This will cause transistor 88A to become conductive, thereby causing the voltage on word line WL0 to drop. This, in turn, will cause transistor 82A to turn on thereby pulling node 79A up further to voltage $V_p$. As previously noted, voltage $V_{NISO}$ is set to −2 volts so that transistor 86A will also be conductive. Accordingly, transistors 86A and 86B will both be conductive and will pull word line WL0 down to ground potential as will the corresponding transistors associated with deselected word lines WL1-WL6 of Erase Block 0.

With respect to the deselected word lines of the remaining erase blocks, Table 5 indicates that these word lines are also set to ground potential. For all of these deselected erase blocks, the predecode signals XA and XB will such that the output of the corresponding NAND gate 74 output will be at a high level. For those deselected word lines where predecode signal $X_{CH7}$ is used, that predecode will be at a high level in the present example so that transistor 78 will be on thereby connecting the high output of NAND gate 74 to node 79. For those selected word lines where predecode signals $X_{CH0}$-$X_{CH6}$ are used, those predecodes will be at a low level. This will cause the associated transistor 78 to be off thereby isolating node 79 from the output of the NAND gate 74. In addition, associated transistor 80 will be turned on by the low level predecode so that node 79 will be pulled up to voltage $V_p$. In either case, a high voltage at node 79 will cause the associated word line to be at ground potential.

As indicated by Table 5, in read operations, the selected source line, SL0 for Erase Block 0, is grounded. The source lines of the remaining Erase Blocks 1-7, including source line SL1, can also be grounded as shown in Table 5.

18

However, it is an objective of the present invention to cause the deselected source lines to be left floating, as also shown in Table 4. This can be accomplished, for example, using the source decoder circuit of FIG. 9. With the array configured as described, a selected cell (or group of cells) associated with a word line (such as line WL7) of Erase Block 0 can be read.

Table 5 also shows the conditions for programming a cell or group of cells of the FIG. 11 array arrangement. Again, all of the P channel erase transistors T0-T511 are turned off since control signals $G_0$ and $G_1$ (and signals $G_2$-$G_7$ not depicted) are all set to a positive voltage (+11 volts). The X Decoder 72 supply voltage $V_p$ is set to +11 volts and the decoding circuitry is caused to apply this voltage to the selected word line based upon the address being used in the programming operation. Thus, for example, if word line WL7 is the selected word line, predecode signals $X_{A0}$, $X_{B0}$ and $X_{CH7}$ (FIG. 13) are all at a high level so that transistor 84B will pull word line WL7 up to voltage $V_p$ set to +11 volts.

The deselected word lines WL0-WL6 of selected Erase Block 0 are set to ground potential in the programming operation since the predecode signals $X_{CH0}$-$X_{CH6}$ associated with the deselected word lines will be at a low level. Voltage $V_{NISO}$ is set to −2 volts according to Table 5 therefore both transistors 86B and 88B will be turned on connecting these deselected word lines to ground as was the case during read operations. In addition, the word lines of the deselected erase blocks will be at ground potential for the same reasons previously set forth in connection with the description of an exemplary read operation. However, it is again an object of the present invention to have the source line of the deselected erase blocks be left floating in programming operations as is the case of these source lines during read operations.

Figure 12:
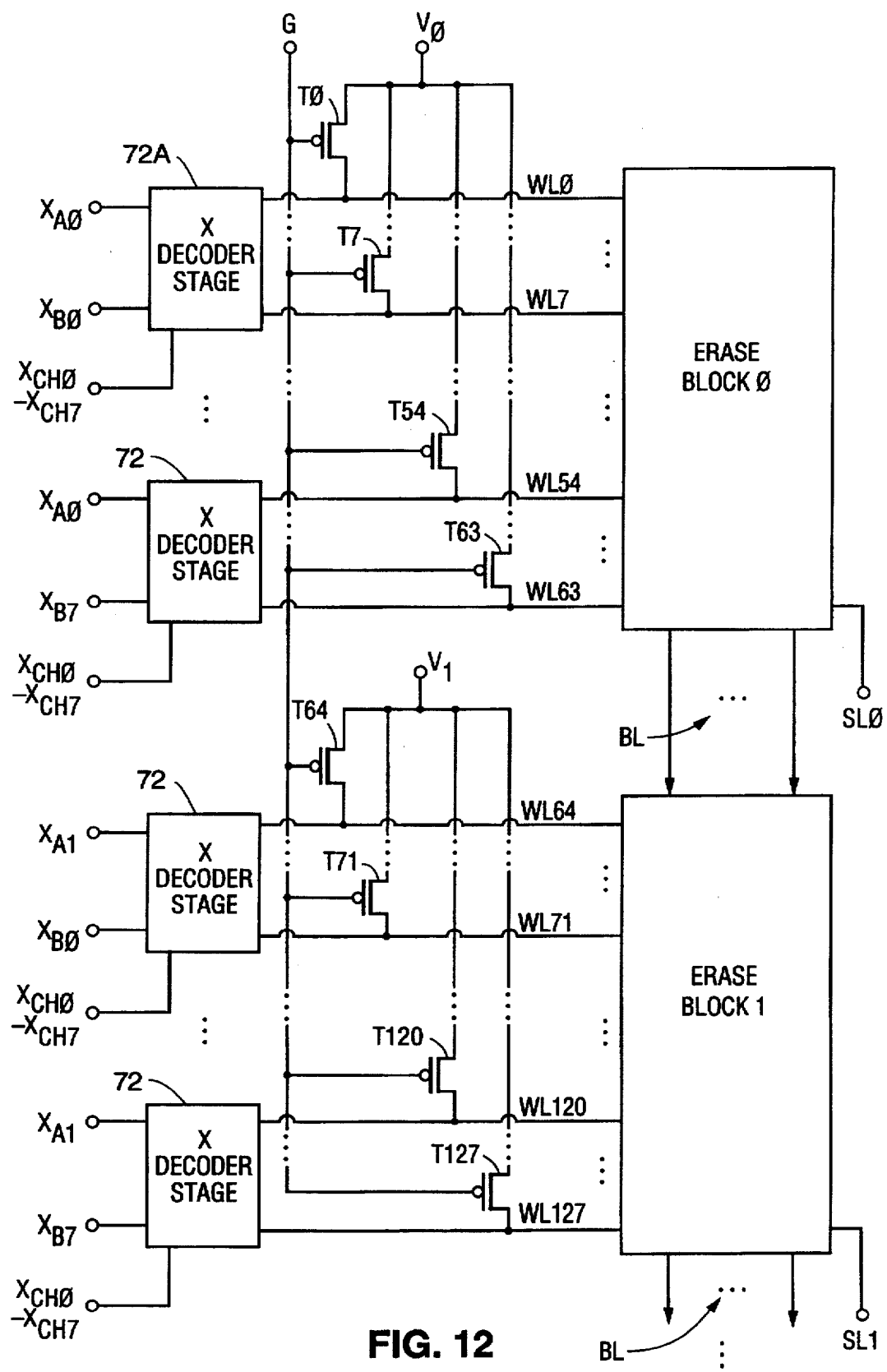
FIG. 12 is a block diagram of a further embodiment of a segmented flash array arrangement utilizing negative gate erase techniques.

In erase operation, a single erase block of the array may be erased as previously described. As can be seen in Table 5, if Erase Block 0 is the selected block to be erased, signal $G_0$ is set to −12 volts thereby turning on erase transistors T0-T63 (FIG. 12). In addition, voltage $V_0$ is set to −10 volts so that all sixty-four word lines of Erase Block 0 are connected to −10 volts by the associated erase transistor T0-T63.

As can also be seen from Table 5, all sixty-four of the X Decoder Stages 72 of the array have their common supply voltage $V_p$ set to ground potential. In addition, voltage $V_{NISO}$ is set to ground potential so that the P channel transistor 86 (FIG. 13) in each of the X Decoder Stages 72 is turned off thereby isolating the N channel transistors 88 from the negative voltage which is applied to the word lines of Selected Erase Block 0.

The erase transistors T64-T511 of the deselected erase blocks are all turned off since the voltage applied to the gates, including $G_1$, is at ground potential. In addition, the associated X Decoder Stage 72 output is isolated from the word lines so that the word lines of the deselected erase blocks will be at a high impedance level. The deselected word lines will assume a voltage ranging from ground potential to the threshold voltage $V_T$ of the P channel transistor 84 located in the associated X Decoder Stage 72, as indicated in Table 5. This threshold voltage is typically +1 volt.

The source line of the selected Erase Block 0, source line SL0, is set to voltage $V_A$ which is typically +5 volts. By way of example, the Global Source line of the FIG. 9 source decoder circuit will be set to voltage $V_a$ and signal S0 is made to turn on transistors 56A and 56B. In addition, the voltage of the source lines associated with the deselected erase blocks, such as source line SL1, are set to a voltage $V_B$. This is accomplished by setting the Deselected Source Bus of the FIG. 9 decoder circuit to voltage $V_B$ and turning on the transistors 66A, 66B and 68 associated with the selected source lines. Voltage $V_B$ is selected to be intermediate threshold voltage $V_T$ and voltage $V_A$ applied to the selected source line. Thus, if threshold voltage $V_T$ is +1 volt and voltage $V_A$ is +5 volts, $V_B$ may be set to +3 volts. If voltage $V_B$ is set too high, there will be an increased tendency for the cells of the deselected erase blocks to be slightly erased each time one of the other erase blocks is erased. This phenomena is sometimes referred to as source erase disturb. If, on the other hand, voltage VB is too low, there will be a tendency to turn on the deselected flash cells, or to cause them to leak, since the control gate voltage of the flash cells will typically be at voltage $V_T$ due to the previously described influence of the associated X Decoder Stage 72. These conditions will cause the selected Erase Block 0 to become erased. As also indicated by Table 5, the deselected course lines can also be placed in a floating state in erase operations.

FIG. 12 shows an alternative embodiment of an array arrangement for use in the subject invention. Those elements of the alternative embodiment that are similar to the FIG. 11 embodiment have the same numerical designation. This array arrangement also utilizes negative gate erase during erase operations. However, rather than having a separate control signal $G_0$–$G_7$ for each of the eight Erase Blocks 0–7, there is single control signal G common to all eight blocks. Other aspects of the FIG. 12 embodiment are the same as that of FIG. 11 with the exception of the differences noted in the following description. Thus, the FIG. 12 array arrangement is somewhat simpler to implement than is the FIG. 11 embodiment.

Table 6 shows the conditions for reading, programming and erasing the FIG. 12 array arrangement. In read operations, signal G is set to +5 volts so that all of the erase transistors T0–T511 are turned off. Similarly, in program operations, signal G is set to +11 volts so that all of the erase transistors are turned off. The X Decoders stages 72 used in the FIG. 12 embodiment are the same used in the previously described FIG. 11 embodiment. Since the erase transistors T0–T511 are in the same corresponding disabled state as in the FIG. 11 embodiment, the conditions created by the X Decoder Stages 72 in read and program operations are the same and need not be further described.

In erase operations, assume that Erase Block 0 is to be erased. Common signal G is set to −12 volts and voltage $V_0$ associated with Erase Block 0 is set to −10 volts. Thus, erase transistors T0–T63 are turned on thereby connecting all of the word lines WL0–WL63 of Erase Block 0 to −10 volts. The deselected voltages, including $V_1$ are all set to ground potential. Thus, the remaining erase transistors T63–T511 are all turned on thereby connecting all of the deselected word lines WL64–WL511 to ground.

TABLE 6

| FUNCTION | READ | PROGRAM | ERASE |
|---|---|---|---|
| G | +5 volts | +11 volts | −12 volts |
| $V_0$ | +5 volts | +11 volts | −10 volts |
| $V_1$ | +5 volts | +11 volts | 0 volts |
| X-DECODER SUPPLY $V_P$ | +5 volts | +11 volts | 0 volts |
| WL-BLOCK 0 | selected | selected | |

TABLE 6-continued

| FUNCTION | READ | PROGRAM | ERASE |
|---|---|---|---|
| (SELECTED BLOCK) | +5 volts deselected 0 volts | +11 volts deselected 0 volts | −10 volts 0 volts |
| WL-BLOCK 1 (DESELECTED BLOCKS) | 0 volts | 0 volts | 0 volts |
| SL0 | 0 volts | 0 volts | $V_A$ |
| SL1 (DESELECTED SOURCES) | 0 volts float | 0 volts float | $V_B$ float |
| $V_{NISO}$ | −2 volts | −2 volts | 0 volts |

As also indicated by Table 6, the selected source line SL0 is set to voltage $V_A$ which, as previously noted, is typically +5 volts. The deselected source lines, including source line S1, are connected to voltage $V_B$ which, as also previously noted, is set to +3 volts, a voltage selected to be greater than the threshold voltage of the X Decoder Stage 72 P channel transistor 86 (FIG. 13) and lower than voltage $V_A$. Again, voltage $V_{NISO}$ is set to 0 volts thereby turning off transistor 86 of the X Decoder Stages 72 and isolating the N channel transistors 88 from the negative voltage applied to the word lines WL0–WL63 of Erase Block 0. Although not set forth in Table 6, the bit lines common to all of the erase blocks are left floating. This combination of conditions will cause the cells of Erase Block 0 to be erased.

As indicated by Table 6, in erase operations, the deselected source lines can also be left floating. This approach is preferred since, as previously noted, a defect is a deselected erase block will not adversely affect the operation of the selected erase block.

Thus, a novel flash cell array arrangement divided into array segments having separate source lines and associated source line decode circuitry has been disclosed. Although a various embodiments of the subject invention have been described in some detail, it is to be understood that certain changes can be made by those skilled in the art without departing from the spirit and scope of the invention as defined by the appended claims.

I claim:

1. A flash memory array arrangement comprising:
   a plurality of erase blocks, with each of the erase blocks including flash memory cells, with the memory cells each including
   (a) a source region,
   (b) a drain region spaced apart from the source region so as to define a channel region intermediate the source and drain regions,
   (c) a control gate disposed over the channel region; and
   (d) a floating gate positioned intermediate and electrically insulated from the channel region and the control gate;
   with each erase block including a group of the memory cells arranged in an array comprising a plurality of rows and a plurality of columns, with each cell in one of the rows having their control gates connected to a common word line and with each cell in one of the columns having their drain regions connected to a common bit line and with each of the source regions being connected to a common source line;
   control means for reading, programming and erasing cells of the array, with the control means including source line control means for causing the common source line of one of the erase blocks to go to a first state when one of the cells of the erase block associated with the common source line is being read and to a second state when a cell of one of the erase blocks other than the associated erase block is being read and for causing the common source line of one of the erase blocks to go to a third state when one of the cells of the erase block associated with the common source line is being programmed and to a fourth state when a cell of one of the erase blocks other than the associated erase block is being programmed and for causing the common source line of one of the erase blocks to go to a fifth state when the cells of the erase block associated with the common source line are being erased and to a sixth state when one of the erase blocks other than the associated erase block is being erased and wherein at least one of the second, fourth and sixth states is a high impedance state.

2. The array arrangement of claim 1 wherein at least two of the second, fourth and sixth states are a high impedance state.

3. The array arrangement of claim 2 wherein all of the second, fourth and sixth states are a high impedance state.

4. The array arrangement of claim 1 wherein the first state results in the common source line being at a ground potential relative to an array circuit common.

5. The array arrangement of claim 1 wherein the third state results in the common source line being at a ground potential relative to the array circuit common.

6. The array arrangement of claim 1 wherein the control means causes the word lines of an erase block to be at a first negative voltage relative to an array circuit common when the erase block associated with the word lines is being erased and wherein the fifth state results in the common source line being at first positive voltage relative to the array circuit common.

7. The array arrangement of claim 6 wherein the sixth state is a high impedance state.

8. The array arrangement of claim 6 wherein the sixth state results in the common source line being at a second positive voltage relative to the array circuit common.

9. The array arrangement of claim 8 wherein the first positive voltage has a magnitude which is greater than a magnitude of the second positive voltage.

10. The array arrangement of claim 1 wherein the source line control means includes an N channel MOS transistor associated with each of the common source lines, with a drain terminal of the MOS transistor being connected to the associated common source line and with all of the transistor having their source terminals connected to a common global source line.

11. The array arrangement of claim 10 wherein the MOS transistors have gate terminals connected to receive separate control signals, with the MOS transistor associated with one of the common source lines being switched to a non-conductive state by the control signal of the MOS transistor so that the associated common source line is the high impedance state.

12. The array arrangement of claim 11 wherein each of the erase blocks has a plurality of the common source lines and wherein the source line control means includes a separate one of the MOS transistors for each of the plurality of common source lines, with the MOS transistors associated with one of the plurality of common source lines connected to receive a common one of the control signals so that the associated plurality of common source lines for one of the erase blocks are at the same state when cells of the array are being read, programmed and erased.

13. An arrangement of flash memory cells comprising:
first and second erase blocks sharing common bit lines, with each erase block including flash memory cells arranged into an array of rows and columns, with the cells in a column connected to the common bit lines and the cells in a row connected to a common word line and with each erase block including a common source line;
a source line decoder circuit comprising a separate control transistor associated with each of the common source lines, with the control transistor having an input terminal connected to the associated source line and an output terminal connected to a common global source line and a control terminal for receiving a control signal that causes the transistor to switch between a conductive and non-conductive state.

14. The arrangement of claim 13 further including control means for reading, programming and erasing cells of the array and for generating the control signals used by the source line decoder circuit, with the control signal for a control transistor associated with one of the erase blocks causing the control transistor to be switched to a non-conductive state whenever one of the erase blocks other than the associated erase block contains cells that are being read, programmed or erased.

15. The arrangement of claim 14 wherein the control means, during an erasure of one of the erase block, causes a negative voltage, relative to an array circuit common, to be applied to the word lines associated with the erase block, a positive voltage, relative to the array circuit common, to be applied to the global source line and the control signal to be applied to the control transistor associated with the erase block such that the control transistor is switched to the conductive state.

16. The arrangement of claim 15 wherein the control transistors are N channel MOS transistors having a drain terminal, a source terminal and a gate terminal which function as the input, output and control terminals, respectively.

17. The arrangement of claim 13 further including a third one of the erase blocks.

18. A flash memory array arrangement comprising:
a plurality of erase blocks, with each of the erase blocks including flash memory cells, with the memory cells each including a source, a drain and a control gate; with each erase block including a group of the memory cells arranged in an array comprising a plurality of rows and a plurality of columns, with each cell in one of the rows having the control gate connected to a common word line and with each cell in one of the columns having the drain connected to a common bit line and with each of the sources being connected to a common source line;
a memory controller configured to carry out memory operations including reading, programming and erasing the cells of the array, with the memory controller comprising source line control circuitry configured to cause the common source line of one of the erase blocks to go to a first state when one of the cells of the erase block associated with the common source line is being read and to a second state when a cell of one of the erase blocks other than the associated erase block is being read and configured to cause the common source line of one of the erase blocks to go to a third state when one of the cells of the erase block associated with the common source line is being programmed and to a fourth state when a cell of one of the erase blocks other than the associated erase block is being programmed and for causing the common source line of one of the erase blocks to go to a fifth state when the cells of the erase block associated with the common source line are being erased and to a sixth state when one of the erase blocks other than the associated erase block is being erased and wherein at least one of the second, fourth and sixth states is a high impedance state.

19. The array arrangement of claim 18 wherein at least two of the second, fourth and sixth states are a high impedance state.

20. The array arrangement of claim 19 wherein all of the second, fourth and sixth states are a high impedance state.

21. The array arrangement of claim 18 wherein the first state results in the common source line being at a ground potential relative to an array circuit common.

22. The array arrangement of claim 18 wherein the third state results in the common source line being at a ground potential relative to the array circuit common.

23. The array arrangement of claim 18 wherein the memory controller is further configured to cause the word lines of an erase block to be at a first negative voltage relative to an array circuit common when the erase block associated with the word lines is being erased and wherein the fifth state results in the common source line being at a first positive voltage relative to the array circuit common.

24. The array arrangement of claim 23 wherein the sixth state is a high impedance state.

25. The array arrangement of claim 23 wherein the sixth state results in the common source line being at a second positive voltage relative to the array circuit common.

26. The array arrangement of claim 25 wherein the first positive voltage has a magnitude which is greater than a magnitude of the second positive voltage.

27. The array arrangement of claim 18 wherein the source line control circuitry includes an N channel transistor associated with each of the common source lines, with a drain terminal of the transistor being connected to the associated common source line and with all of the transistors having their source terminals connected to a common global source line.

28. The array arrangement of claim 27 wherein the transistors have gate terminals connected to receive separate control signals, with the transistor associated with one of the common source lines being switched to a non-conductive state by the control signal of the transistor so that the associated common source line is in the high impedance state.

29. The array arrangement of claim 28 wherein each of the erase blocks has a plurality of the common source lines and wherein the source line control circuitry includes a separate one of the transistors for each of the plurality of common source lines, with the transistors associated with one of the plurality of common source lines connected to receive a common one of the control signals so that the associated plurality of common source lines for one of the erase blocks are at the same state when cells of the array are being read, programmed and erased.

30. An arrangement of flash memory cells comprising:
first and second erase blocks sharing common bit lines, with each erase block including flash memory cells arranged into an array having a plurality of rows and a plurality of columns, with the cells in a column connected to the common bit lines and the cells in a row connected to a common word line and with each erase block including a common source line;
a source line decoder circuit comprising a separate control transistor associated with each of the common source lines, with the control transistor being disposed outside the array and having an input terminal connected to the associated source line and an output terminal connected to a common global source line and a control terminal for receiving a control signal that causes the transistor to switch between a conductive and non-conductive state.

31. The arrangement of claim 13 further including control circuitry configured to carry out reading, programming and erasing operations on the cells of the array and to generate the control signals used by the source line decoder circuit, with the control signal for a control transistor associated with one of the erase blocks causing the control transistor to be switched to a non-conductive state whenever one of the erase blocks other than the associated erase block contains cells that are being read, programmed or erased.

32. The arrangement of claim 31 wherein the control circuitry, during an erasure of one of the erase block, causes a negative voltage, relative to an array circuit common, to be applied to the word lines associated with the erase block, a positive voltage, relative to the array circuit common, to be applied to the global source line and the control signal to be applied to the control transistor associated with the erase block such that the control transistor is switched to the conductive state.

33. The arrangement of claim 32 wherein the control transistors are N channel transistors having a drain terminal, a source terminal and a gate terminal which function as the input, output and control terminals, respectively.

34. The arrangement of claim 30 further including a third one of the erase blocks.

35. A method of controlling the operation of an array arrangement of flash memory cells, with the array arrangement comprising a plurality of erase blocks, with each of the erase blocks comprising an array of the cells, with the cells being arranged into a plurality of rows and columns, with each cell in one of the columns being connected to a common bit line and with each cell in one of the rows being connected to a common word line and with each cell being connected to a common source line, said method comprising the following steps:
selecting a first one of the erase block on which a memory operation is to be performed, with remaining erase blocks being deselected;
setting the source line of the selected erase block to a first state and the source line of the deselected erase blocks to a second state in the event the memory operation is a read operation;
setting the source line of the selected erase block to a third state and the source line of the deselected erase blocks to a fourth state in the event the memory operation is a program operation;
setting the source line of the selected erase block to a fifth state and the source line of the deselected erase blocks to a sixth state in the event the memory operation is an erase operation, with at least one of the second, fourth and sixth states being a high impedance state; and
completing the memory operation on the selected erase block.

36. The method of claim 35 wherein at least two of the second, fourth and sixth states are a high impedance state.

37. The method of claim 36 wherein at least three of the second, fourth and sixth states are a high impedance state.

38. The method of claim 37 wherein the step of setting the source line to the first state comprises the step of setting the source line to ground potential relative to a circuit common.

39. The method of claim 38 wherein the step of setting the source line to the third state comprises the step of setting the source line to ground potential relative to a circuit common.

40. The method of claim 35 wherein the step of completing the memory operation includes the step of applying a first negative voltage relative to an array circuit common to the word lines of the selected erase block and wherein the step of setting the source line to the fifth state comprises the step of setting the source line to a first positive voltage relative to the array circuit common.

41. The method of claim 40 wherein the sixth state is a high impedance state.

42. The method of claim 41 wherein the step of setting the source line of the selected erase block to the high impedance state comprises the step of setting the source line to a second positive voltage relative to the array circuit common.

* * * * *